(12) United States Patent
Aoai et al.

(10) Patent No.: US 6,632,586 B1
(45) Date of Patent: *Oct. 14, 2003

(54) POSITIVE RESIST COMPOSITION

(75) Inventors: Toshiaki Aoai, Shizuoka (JP); Kenichiro Sato, Shizuoka (JP)

(73) Assignee: Fuji Photo Film Co., Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/392,588

(22) Filed: Sep. 9, 1999

(30) Foreign Application Priority Data

Sep. 24, 1998 (JP) .......................................... 10-270041

(51) Int. Cl.[7] .............................. G03C 1/72; G03C 1/73
(52) U.S. Cl. ................................ 430/287.1; 430/285.1; 430/280.1; 430/270.1; 430/905; 430/910
(58) Field of Search .................... 430/280.1, 270.1, 430/285.1, 905, 914, 287.1, 326, 906, 907, 910

(56) References Cited

U.S. PATENT DOCUMENTS 5,738,975 A * 4/1998 Nakano et al. ............ 430/280.1
5,942,367 A * 8/1999 Watanabe et al. ......... 430/270.1

* cited by examiner

*Primary Examiner*—Janet Baxter
*Assistant Examiner*—Sin J. Lee
(74) *Attorney, Agent, or Firm*—Sughrue Mion, PLLC

(57) ABSTRACT

A positive resist composition which comprises (A) a compound which generates an acid upon irradiation with an actinic ray or radiation, and (B) a resin which is decomposed by the action of an acid to increase solubility in an alkaline developing solution and contains repeating units represented by formulae (I) and (V):

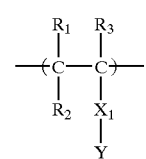

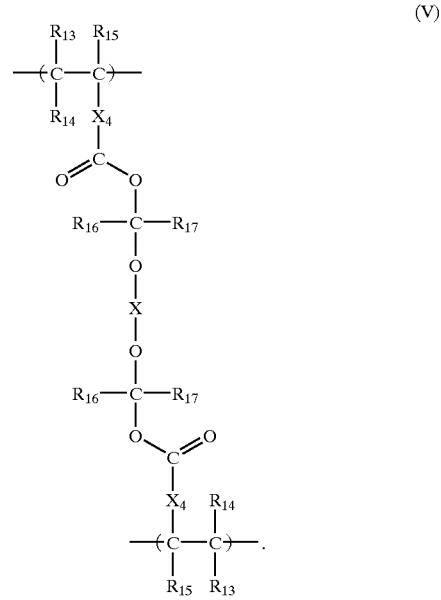

10 Claims, No Drawings

POSITIVE RESIST COMPOSITION

FIELD OF THE INVENTION

The present invention relates to a positive resist composition for use in the production of a semiconductor such as IC, in the production of a circuit board such as liquid crystal and thermal head and in other photofabrication processes. More specifically, the present invention relates to a positive resist composition suitably employed in a case where a far ultraviolet ray of 220 nm or less is used as an exposure light source.

BACKGROUND OF THE INVENTION

A positive photoresist composition includes a composition comprising an alkali-soluble resin and a naphthoquinonediazide compound as a photosensitive material.

However, integrated circuits are being more and more intensified in the integration degree and the production of a semiconductor substrate such as VLSI requires working of an ultrafine pattern comprising lines having a width of a half micron or less.

According to one of known techniques for achieving miniaturization of a pattern, a resist pattern is formed using an exposure light source having a shorter wavelength. This technique can be described using the following Rayleigh's formula showing resolution R (line width) of an optical system:

$$R = k \cdot \lambda / NA$$

(wherein $\lambda$ is a wavelength of the exposure light source, NA is a numerical aperture of the lens and k is a process constant). As is apparent from the formula, higher resolution, namely, a smaller R value can be obtained by reducing the wavelength $\lambda$ of the exposure light source.

For example, in the production of a DRAM having an integration degree up to 64 M bits, the i-line (365 nm) of a high-pressure mercury lamp is used at present as the light source. In the mass production of 256 M bit DRAMs, use of a KrF excimer laser (248 nm) in place of the i-line has been studied. Further, for the purpose of producing DRAMs having an integration degree of 1 G bits or more, a light source having a further shorter wavelength has been investigated. To this effect, an ArF excimer laser (193 nm), an $F_2$ excimer laser (157 nm), an X ray, an electron beam and the like are considered to be effective (see, Takumi Ueno et al., *Tanpacho Photoresist Zairyo—ULSI Ni Muketa Bisai Kako*—(Short Wavelength Photoresist Material—Fine Working Toward ULSI—), Bunshin Shuppan (1988)).

When a conventional resist comprising a novolak resin and a naphthoquinonediazide compound is used for the pattern formation by photolithography with a far ultraviolet ray or excimer laser beam, the novolak resin and naphthoquinonediazide compound exhibit strong absorption in the far ultraviolet region and the light scarcely reaches the bottom of resist. As a result, the resist has low sensitivity and only a tapered pattern can be obtained.

One of the techniques for solving this problem is a chemical amplification-type resist composition described in U.S. Pat. No. 4,491,628 and European Patent 249,139. The chemical amplification-type positive resist composition is a pattern formation material which generates an acid in the exposed area on irradiation of radiation such as a far ultraviolet ray and due to the reaction using the acid as a catalyst, differentiates solubility in a developing solution between the area irradiated with the active radiation and the non-irradiated area to form a pattern on a substrate.

Examples thereof include combinations of a compound capable of generating an acid by photolysis with an acetal or O,N-acetal compound (see, JP-A-48-89003 (the term "JP-A" as used herein means an "unexamined published Japanese patent application"), with an ortho ester or amide acetal compound (JP-A-51-120714), with a polymer having an acetal or ketal group in the main chain (JP-A-53-133429), with an enol ether compound (JP-A-55-12995), with an N-acyliminocarbonic acid compound (JP-A-55-126236), with a polymer having an ortho ester group in the main chain (JP-A-56-17345), with a tertiary alkyl ester compound (JP-A-60-3625), with a silyl ester compound (JP-A-60-10247) or with a silyl ether compound (JP-A-60-37549 and JP-A-60-121446). These combinations in principle have a quantum yield exceeding 1 and therefore exhibit high photosensitivity.

A system which decomposes by heating in the presence of an acid and becomes soluble in alkali is also used and examples thereof include combinations of a compound capable of generating an acid on exposure with an ester or carbonic acid ester compound having a tertiary or secondary carbon (e.g., tert-butyl, or 2-cyclohexenyl) described, for example, in JP-A-59-45439, JP-A-60-3625, JP-A-62-229242, JP-A-63-27829, JP-A-63-36240, JP-A-63-250642, JP-A-5-181279, *Polym. Eng. Sce.*, Vol. 23, page 1012 (1983), *ACS. Sym.*, Vol. 242, page 11 (1984), *Semiconductor World*, November, 1987, page 91, *Macromolecules*, Vol. 21, page 1475 (1988), and SPIE, Vol. 920, page 42 (1988), with an acetal compound described, for example, in JP-A-4-219757, JP-A-5-249682 and JP-A-6-65332, or with a tert-butyl ether compound described, for example, in JP-A-4-211258 and JP-A-6-65333.

Such systems are mainly composed of a resin having a basic skeleton of poly(hydroxystyrene) which has small absorption in the region around 248 nm and therefore, when the exposure light source is a KrF excimer laser, they have high sensitivity and high resolution and are capable of forming a good pattern. Thus they can form good systems as compared with conventional naphthoquinonediazide/novolak resin systems.

However, when the light source has a still shorter wavelength, for example, when the exposure light source used is an ArF excimer laser (193 nm), the above-described chemical amplification systems are yet deficient because the compound having an aromatic group substantially has large absorption in the region of 193 nm. As a polymer having small absorption in the 193 nm region, the use of poly(meth)acrylate is described in *J. Vac. Sci. Technol.*, B9, 3357 (1991). However, this polymer has a problem in that the resistance against dry etching which is commonly performed in the production process of semiconductors is low as compared with conventional phenol resins having aromatic groups.

In *Proc. of SPIE*, 1672, 66 (1922), it is reported that polymers having alicyclic groups exhibit the dry etching resistance on a level with the polymers having aromatic groups and at the same time, have small absorption in the 193 nm region. The use of these polymers has been aggressively studied in recent years. Specific examples thereof include the polymers described, for example, in JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511, JP-A-7-252324 and JP-A-8-259626. In the polymers having alicyclic groups described above, a carboxy group is used in place of a phenolic hydroxy group as the group of imparting solubility in an alkaline developing solution in order to reduce the absorption in the 193 nm region. However, since the carboxy group has large solubility in the developing solution, even the unexposed area dissolves at the development to cause a problem of decrease in film thickness, when developed with a developing solution hitherto used for resist materials (for example, a 2.38% aqueous solution of tetramethylammonium hydroxide).

In order to solve the problem, it is required to dilute the developing solution and decrease its concentration or to reduce the content of carboxy group in the polymer. However, when the concentration of developing solution decreases, reproducibility of the development becomes an issue. On the other hand, when the content of carboxy group in the polymer is reduced, the adhesion of polymer to a substrate disadvantageously deteriorate due to the increase in hydrophobic property of the polymer

SUMMARY OF THE INVENTION

Therefore, an object of the present invention is to provide a positive resist composition suitable for using an exposure light source having a wavelength of 220 nm or less, particularly an ArF excimer laser beam (193 nm).

Another object of the present invention is to provide a positive resist composition which provides high sensitivity and good resolution in the case of using an exposure light source having a wavelength of 220 nm or less, has sufficiently high dry etching resistance and good adhesion to a substrate and exhibits a good developing property even with a developing solution conventionally employed for a resist (for example, a 2.38% aqueous solution of tetramethylammonium hydroxide) to provide an excellent resist pattern profile.

Other objects of the present invention will become apparent from the following description.

As a result of intensive investigations made by the inventors on positive resist compositions while taking the properties described above into consideration, it has been found that the objects of the present invention are successfully accomplished by using a resin of cross-linked type having a polycyclic-type alicyclic group described below, to complete the present invention.

Specifically, the present invention includes the following compositions.

(1) a positive resist composition which comprises (A) a compound which generates an acid upon irradiation with an actinic ray or radiation, and (B) a resin which is decomposed by the action of an acid to increase solubility in an alkaline developing solution and contains a repeating unit represented by the following formula (I) and a repeating unit represented by the following formula (V):

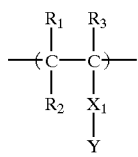
(I)

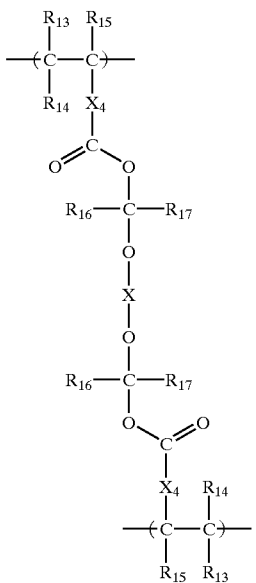

wherein $R_1$, $R_3$, $R_{13}$ and $R_{15}$, which may be the same or different, each independently represents a hydrogen atom, a halogen atom, a cyano group, an alkyl group or a haloalkyl group; $R_2$ and $R_{14}$, which may be the same or different, each independently represents a hydrogen atom, a cyano group, —CO—O$R_{18}$ or —CO—N($R_{19}$)($R_{20}$); $X_1$ and $X_4$, which may be the same or different, each independently represents a single bond, an optionally substituted divalent alkylene, alkenylene or cycloalkylene group, —O—, —SO$_2$—, —O—CO—$R_{21}$—, —CO—O—$R_{22}$— or —CO—N($R_{23}$)—$R_{24}$—; $R_{16}$ and $R_{17}$, which may be the same or different, each independently represents a hydrogen atom, an alkyl group or a cycloalkyl group, or $R_{16}$ and $R_{17}$ may be bonded to each other to form a ring; X represents an optionally substituted divalent alkylene, alkenylene or cycloalkylene group, or a divalent group formed by combining each of these alkylene, alkenylene and cycloalkylene groups with at least one of ether, ester, amido, urethane and ureido groups; Y represents a polycyclic-type alicyclic group; $R_{18}$ represents a hydrogen atom, an alkyl group, a cycloalkyl group, an alkenyl group or an acid-decomposable group (a group which is decomposed by the action of an acid to increase solubility in an alkaline developing solution); $R_{19}$, $R_{20}$ and $R_{23}$, which may be the same or different, each independently represents a hydrogen atom, an alkyl group, a cycloalkyl group or an aklenyl group, or $R_{19}$ and $R_{20}$ may be bonded to each other to form a ring; and $R_{21}$, $R_{22}$ and $R_{24}$, which may be the same or different, each independently represents a single bond or a divalent alkylene, alkenylene or cycloalkylene group, which may contain at least one of ether, ester, amido, urethane and ureido groups, (2) a positive resist composition as described in item (1) above, wherein the resin of component (B) further contains a repeating unit represented by the following formula (II):

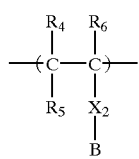

(II)

wherein $R_4$ and $R_6$, which may be the same or different, each independently represents a hydrogen atom, a halogen atom, a cyano group, an alkyl group or a haloalkyl group; $R_5$ represents a hydrogen atom, a cyano group, —CO—$OR_{18}$ or —CO—N $(R_{19})$ $(R_{20})$; $X_2$ represents a single bond, an optionally substituted divalent alkylene, alkenylene or cycloalkylene group, —O—, —$SO_2$—, —O—CO—$R_{21}$—, —CO—O—$R_{22}$— or —CO—N $(R_{23})$ —$R_{24}$—; B represents a group which is decomposed by the action of an acid to increase solubility in an alkaline developing solution (an acid-decomposable group); and $R_{18}$ to $R_{24}$ each has the same meaning as defined above, (3) a positive resist composition as described in item (1) or (2) above, wherein the resin of component (B) further contains a repeating unit represented by the following formula (III):

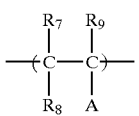

(III)

wherein $R_7$ and $R_9$, which may be the same or different, each independently represents a hydrogen atom, a halogen atom, a cyano group, an alkyl group or a haloalkyl group; $R_8$ represents a hydrogen atom, a cyano group, —CO—$OR_{18}$ or —CO—N$(R_{19})(R_{20})$; A represents a cyano group, —CO—$OR_{18}$ or —CO—N $(R_{19})(R_{20})$; and $R_{18}$ to $R_{20}$ each has the same meaning as defined above, (4) a positive resist composition as described in any one of items (1) to (3) above, wherein the resin of component (B) further contains a repeating unit represented by the following formula (IV):

[K-10]

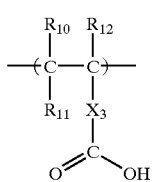

(IV)

wherein $R_{10}$ and $R_{12}$, which may be the same or different, each independently represents a hydrogen atom, a halogen atom, a cyano group, an alkyl group or a haloalkyl group; $R_{11}$ represents a hydrogen atom, a cyano group, —CO—$OR_{18}$ or —CO—N$(R_{19})(R_{20})$; $X_3$ represents a single bond, an optionally substituted divalent alkylene, alkenylene or cycloalkylene group, —O—, —$SO_2$—, —O—CO—$R_{21}$—, —CO—O—$R_{22}$— or —CO—N$(R_{23})$—$R_{24}$—; and $R_{18}$ to $R_{24}$ each has the same meaning as defined above, (5) a positive resist composition as described in any one of items (1) to (4) above, wherein the acid-decomposable group contained in the resin of component (B) is an acid-decomposable group represented by the following formula (VI) or (VII):

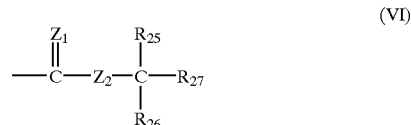

(VI)

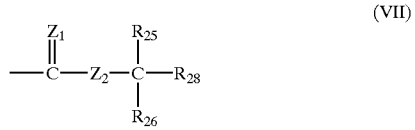

(VII)

wherein $Z_1$ and $Z_2$, which may be the same or different, each independently represents an oxygen atom or a sulfur atom; $R_{25}$ to $R_{27}$, which may be the same or different, each independently represents a hydrogen atom, an alkyl group, a cycloalkyl group, an alkenyl group, an acyl group or an alkoxycarbonyl group; and $R_{28}$ represents an alkyl group, a cycloalkyl group or an alkenyl group, provided that at least two of $R_{25}$ to $R_{27}$ in formula (VI) represent the groups other than a hydrogen atom; or two of $R_{25}$ to $R_{27}$ in formula (VI) or two of $R_{25}$, $R_{26}$ and R28 in formula (VII) may be bonded to each other to form a three-membered to eight-membered cyclic structure comprising carbon atoms and optionally one or more hetero atoms, (6) a positive resist composition as described in any one of items (1) to (5) above, wherein the resin of component (B) is a resin obtained by a reaction between a resin containing a repeating unit represented by formula (I) described above and a repeating unit represented by formula (IV) described above and a compound represented by the following formula (VIII):

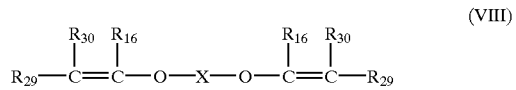

(VIII)

wherein $R_{16}$ and X have the same meaning as defined in formula (V); $R_{29}$ and $R_{30}$, which may be the same or different, each independently represents a hydrogen atom, an alkyl group or a cycloalkyl group; two of $R_{16}$, $R_{29}$ and $R_{30}$ may be bonded to each other to form a three-membered to eight-membered cyclic structure comprising carbon atoms and optionally one or more hetero atoms, (7) a positive resist composition as described in any one of items (1) to (6) above, wherein the composition further comprises a low molecular weight acid-decomposable dissolution inhibiting compound solubility of which in an alkaline developing solution increases by the action of an acid and which has a group capable of being decomposed by the action of an acid and a molecular weight of 3,000 or less, and (8) a positive resist composition as described in any one of items (1) to (7) above, wherein the composition is suitable for exposure using a far ultraviolet ray having a wavelength of 220 nm or less as an exposure light source.

DETAILED DESCRIPTION OF THE INVENTION

The resin of component (B) for use in the present invention is characterized by containing a polycyclic-type alycyclic group and a cross-linked structure. Due to using the resin of component (B), it has become possible to reconcile the developing property with an alkaline developing solution and the dry etching resistance while maintaining the adhesion to a substrate in the unexposed area. Since the cross-linked structure present in the resin is an acid-decomposable acetal ester structure, in the exposed area the acetal ester cross-linked structure is decomposed by an acid generated upon exposure and good developing property with an alkaline developing solution is achieved. As a result, a large discrimination in dissolution can be obtained.

Now, the compounds for use in the resist composition according to the present invention will be described in detail below.

[1] Resin of Component (B)

The resin of component (B) according to the present invention is a resin essentially containing the repeating unit having a polycyclic-type alicyclic group represented by formula (I) described above and the repeating unit having a cross-linked structure represented by formula (V) described above.

The resin of component (B) preferably contains the repeating unit represented by formula (II) described above, which has a group which is decomposed by the action of an acid to increase solubility in an alkaline developing solution. By the incorporation of the repeating unit represented by formula (V) and the repeating unit represented by formula (II), the discrimination in dissolution can be more intensified and the resolution is improved.

The resin of component (B) preferably contains the repeating unit having a carboxy group represented by formula (IV) described above. By the incorporation of the repeating unit represented by formula (IV), the developing property is improved.

The resin of component (B) may preferably contain the repeating unit represented by formula (III) described above. By the incorporation of the repeating unit represented by formula (III), detailed control of various properties of the resist can be attained.

In formulae (I) to (V), the alkyl group represented by any one of $R_1$, $R_3$, $R_4$, $R_6$, $R_7$, $R_9$, $R_{10}$, $R_{12}$, $R_{13}$ and $R_{15}$ includes preferably an alkyl group having from 1 to 4 carbon atoms which may be substituted, for example, methyl, ethyl, propyl, n-butyl or sec-butyl. The haloalkyl group includes preferably an alkyl group having from 1 to 4 carbon atoms substituted with a fluorine atom, a chlorine atom or a bromine atom, for example, fluoromethyl, chloromethyl, bromomethyl, fluoroethyl, chloroethyl or bromoethyl.

The alkyl group represented by any one of $R_{16}$ to $R_{20}$, $R_{23}$, $R_{29}$ and $R_{30}$ includes preferably an alkyl group having from 1 to 8 carbon atoms which may be substituted, for example, methyl, ethyl, propyl, n-butyl, sec-butyl, hexyl, 2-ethylhexyl or octyl. The cycloalkyl group includes preferably a monocyclic-type cycloalkyl group having from 3 to 8 carbon atoms which may be substituted, for example, cyclopropyl, cyclopentyl or cyclohexyl, and a polycyclic-type group, for example, adamantyl, norbornyl, isoboronyl, dicyclopentyl, σ-pinel or tricyclodecanyl.

The alkenyl group represented by any one of $R_1$ to $R_{20}$ and $R_{23}$ includes preferably an alkenyl group having from 2 to 6 carbon atoms which may be substituted, for example, vinyl, propenyl, allyl, butenyl, pentenyl, hexenyl or cyclohexenyl.

$R_{16}$ and $R_{17}$ in formula (V) or any two of $R_{16}$, $R_{29}$ and $R_{30}$ in formula (VIII) may be bonded to each other to form a ring. The ring includes preferably a 3-membered to 8-membered ring which may contain one or more hetero atoms, for example, cyclopropyl, cyclopentyl, cyclohexyl, cycloheptyl, tetrahydrofuryl or tetrahydropyranyl. The ring may further have one or more substituents. Further, the ring formed by $R_{19}$ and $R_{20}$ together with the nitrogen atom includes preferably a 5-membered to 8-membered ring. Specific examples thereof include pyrrolidine, piperidine or piperazine.

The alkylene group represented by any one of X and XI to $X_4$ includes preferably an alkylene group having from 1 to 8 carbon atoms which may be substituted, for example, methylene, ethylene, propylene, butylene, hexylene or octylene. The alkenylene group includes preferably an alkenylene group having from 2 to 6 carbon atoms which may be substituted, for example, ethenylene, propenylene or butenylene. The cycloalkylene group includes preferably a cycloalkylene group having from 5 to 18 carbon atoms which may be substituted, for example, cyclopentylene, cyclohexylene, tridecanylene or adamantylene.

Also, X represents a divalent group formed by combining each of these alkylene, alkenylene and cycloalkylene groups with at least one of ether, ester, amido, urethane and ureido groups.

The alkylene, alkenylene and cycloalkylene group represented by any one of $R_{21}$, $R_{22}$ and $R_{24}$ are same as those described above. Also, $R_{21}$, $R_{22}$ and $R_{24}$ each independently represents a divalent group formed by combining each of these alkylene, alkenylene and cycloalkylene groups with at least one of ether, ester, amido, urethane and ureido groups.

The halogen atom includes a fluorine atom, a chlorine atom, a bromine atom and an iodine atom.

The resin containing the repeating unit represented by formula (I) and the repeating unit represented by formula (V) is preferably obtained by reacting a resin containing the repeating unit represented by formula (I) and the repeating unit represented by formula (IV) with a compound represented by formula (VIII). Specifically, it can be prepared by an addition reaction between the repeating unit represented by formula (IV) in the resin containing the repeating unit represented by formula (I) and the repeating unit represented by formula (IV) and a compound represented by formula (VIII) in the presence of an acid catalyst.

Specific examples of the compound represented by formula (VIII) are set forth below, but the present invention should not be construed as being limited thereto.

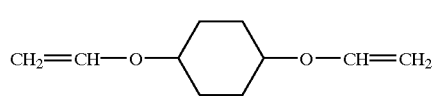

(d1)

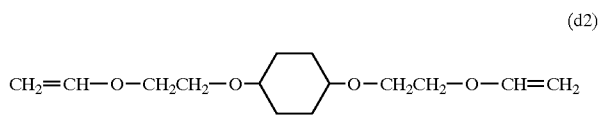

(d2)

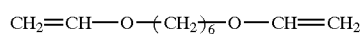 (d3)
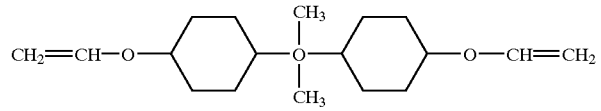 (d4)
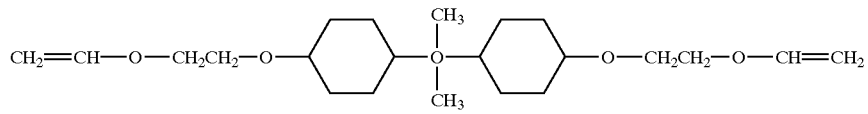 (d5)
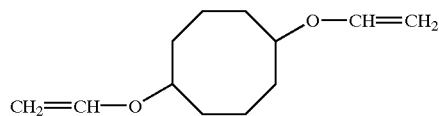 (d6)
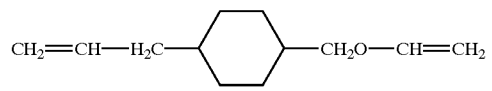 (d7)
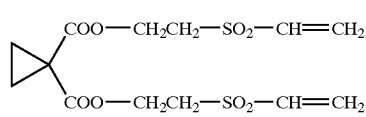 (d8)
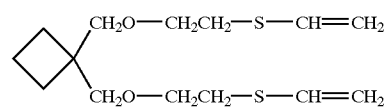 (d9)
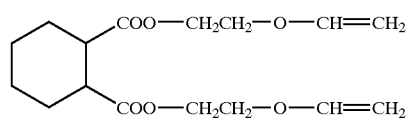 (d10)
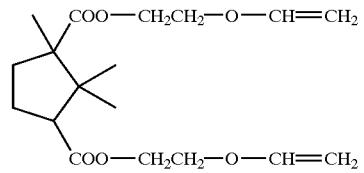 (d11)
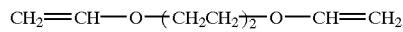 (d12)
 (d13)
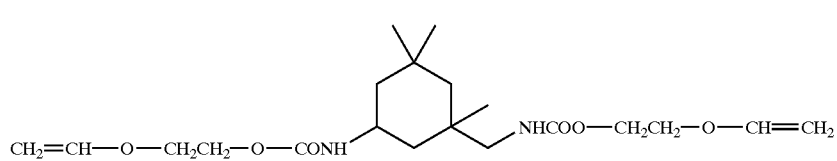 (d14)
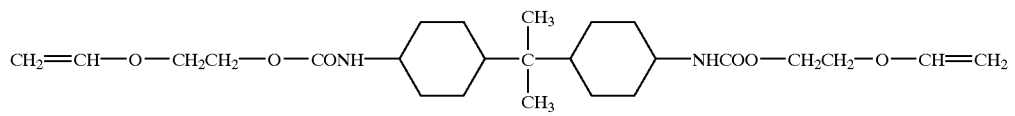 (d15)
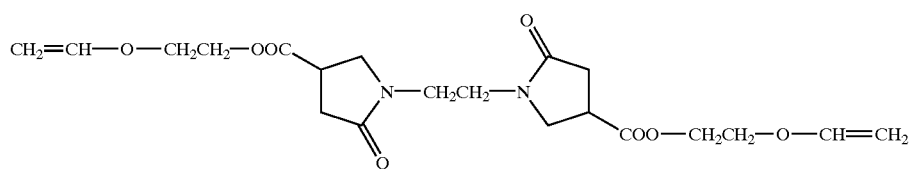 (d16)
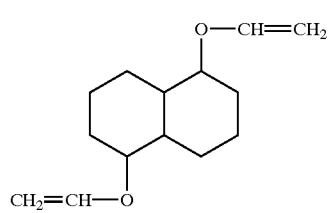 (d17)
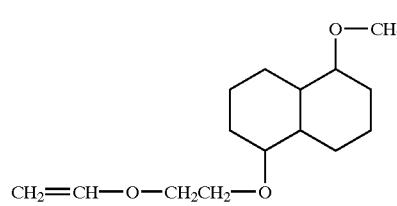 (d18)

-continued
(d19)
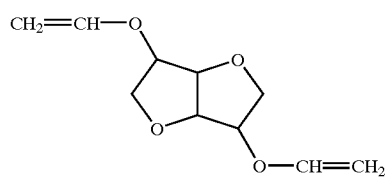
(d20)
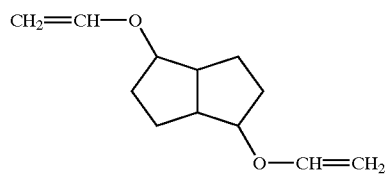
(d21)
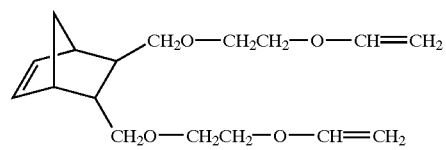
(d22)
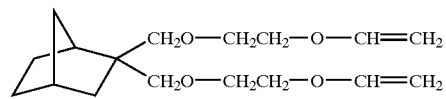
(d23)
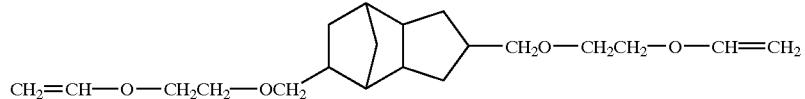
(d24)
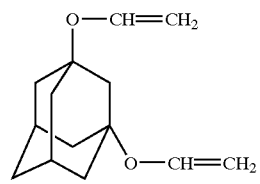
(d25)
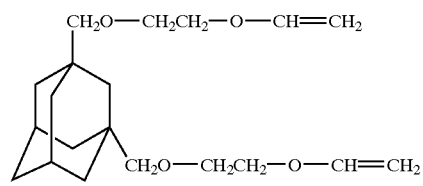
(d26)
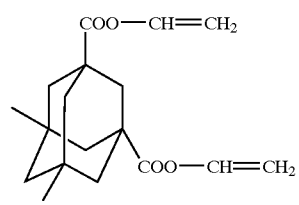
(d27)
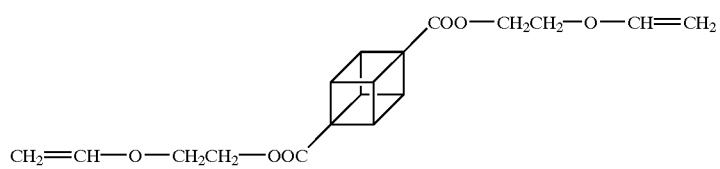
(d28)
(d29)
(d30)
(d31)
(d32)
(d33)
(d34)

The content of the repeating unit represented by formula (V) in the resin of component (B) is preferably from 0.1 to 10% by mole, more preferably from 0.2 to 7% by mole, still more preferably from 0.3 to 5% by mole, based on the total repeating units.

The acid-decomposable group represented by $R_{18}$ or B in the resin of component (B) includes a group which is hydrolyzed by the action of an acid to form an acid and a group which releases a carbon cation by the action of an acid to form an acid. Preferred examples thereof include groups represented by formula (VI) or (VII) described above.

In formulae (VI) and (VII), the alkyl group represented by any one of $R_{25}$ to $R_{28}$ includes preferably an alkyl group having from 1 to 8 carbon atoms which may be substituted, for example, methyl, ethyl, propyl, n-butyl, sec-butyl, hexyl, 2-ethylhexyl or octyl. The cycloalkyl group includes preferably a cycloalkyl group having from 3 to 8 carbon atoms which may be substituted, for example, cyclopropyl, cyclopentyl or cyclohexyl. The alkenyl group includes preferably an alkenyl group having from 2 to 6 carbon atoms which may be substituted, for example, vinyl, propenyl, allyl, butenyl, pentenyl, hexenyl or cyclohexenyl.

The acyl group represented by any one of $R_{25}$ to $R_{27}$ includes preferably an acyl group having from 2 to 10 carbon atoms which may be substituted, for example, formyl, acetyl, propanoyl, butanoyl or octanoyl. The alkoxycarbonyl group includes preferably an alkoxycarbonyl group having from 2 to 8 carbon atoms which may be substituted, for example, methoxycarbonyl, ethoxycarbonyl, propoxycarbonyl or butoxycarbonyl.

Any two of $R_{25}$ to $R_{27}$ in formula (VI) or any two of $R_{25}$, $R_{26}$ and $R_{28}$ in formula (VII) may be bonded to each other to form a ring. The ring includes preferably a 3-membered to 8-membered ring which may contain one or more hetero atoms, for example, cyclopropyl, cyclopentyl, cyclohexyl, cycloheptyl, tetrahydrofuranyl or tetrahydropyranyl. The ring may further have one or more substituents.

Preferred examples of substituent which may further be possessed by the substituents described above include a hydroxyl group, a halogen atom (e.g., fluorine, chlorine, bromine or iodine), a nitro group, a cyano group, an amido group, a sulfonamido group, an alkyl group such as the alkyl group described for $R_{16}$ to $R_{20}$ and $R_{23}$ above, an alkoxy group having from 1 to 8 carbon atoms, for example, methoxy, ethoxy, hydroxyethoxy, propoxy, hydroxypropoxy or butoxy, an alkoxycarbonyl group, for example, methoxycarbonyl or ethoxycarbonyl, an acyl group, for example, formyl, acetyl or benzoyl, an acyloxy group, for example, acetoxy or butyryloxy, and a carboxy group.

The polycyclic-type alicyclic group represented by Y in the resin of component (B) includes preferably a polycyclic-type alicyclic group having 5 or more carbon atoms which may be substituted, for example, bicyclo, tricyclo or tetracyclo, more preferably a polycyclic-type alicyclic group having from 6 to 30 carbon atoms which may be substituted, still more preferably a polycyclic-type alicyclic group having from 7 to 25 carbon atoms which may be substituted.

Preferred examples of the substituent for the polycyclic-type alicyclic group include a hydroxyl group, a halogen atom (e.g., fluorine, chlorine, bromine or iodine), a nitro group, a cyano group, an amido group, a sulfonamido group, an alkyl group such as the alkyl group described for $R_{16}$ to $R_{20}$ and $R_{23}$ above, an alkoxy group having from 1 to 8 carbon atoms, for example, methoxy, ethoxy, hydroxyethoxy, propoxy, hydroxypropoxy or butoxy, an alkoxycarbonyl group, for example, methoxycarbonyl or ethoxycarbonyl, an acyl group, for example, formyl, acetyl or benzoyl, an acyloxy group, for example, acetoxy or butyryloxy, and a carboxy group.

Representative structural examples of the alicyclic moiety in the polycyclic-type alicyclic group which can be used in the resin according to the present invention are set forth below.

(1)

(2)

(3)

(4)

(5)

(6)

(7)

(8)

(9)

(10)

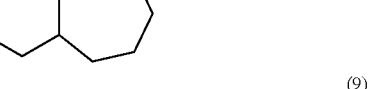

(11)

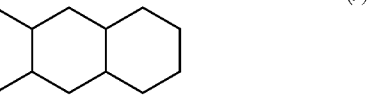

(12)

(13)
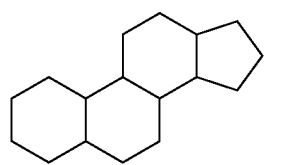
(14)
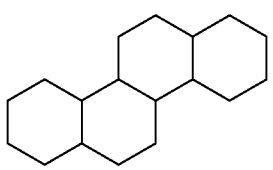
(15)
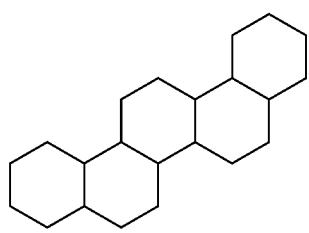
(16)
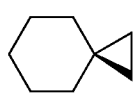
(17)
(18)
(19)
(20)
(21)
(22)
(23)
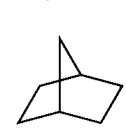
(24)
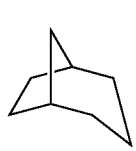
(25)
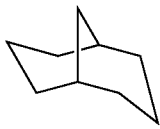
(26)
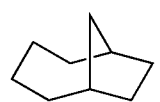
(27)
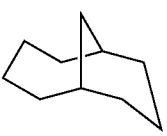
(28)
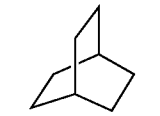
(29)
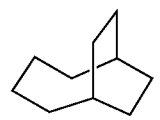
(30)
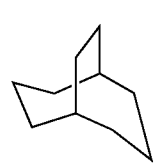
(31)
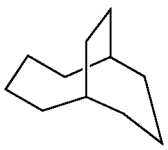
(32)
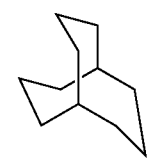
(33)
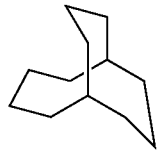
(34)
(35)
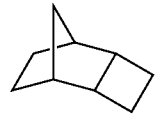

-continued

(36) 

(37) 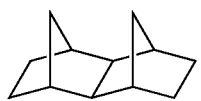

(38) 

(39) 

(40) 

(41) 

(42) 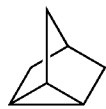

(43) 

(44) 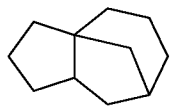

(45) 

(46) 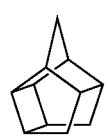

dry etching resistance, developing property with alkali and the like. However, the content thereof is preferably from 30 to 70% by mole, more preferably from 35 to 65% by mole, still more preferably from 40 to 60% by mole, based on the total repeating units.

Specific examples of the repeating unit represented by formula (I) are set forth below, but the present invention should not be construed as being limited thereto.

(a1) 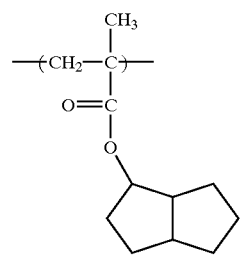

(a2) 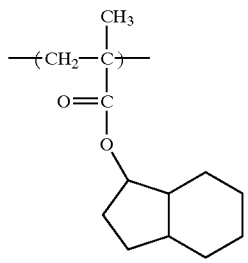

(a3) 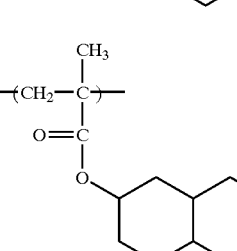

(a4) 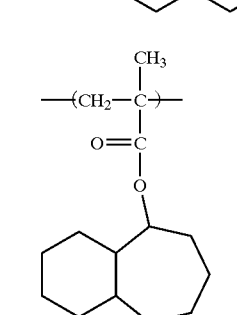

(a5) 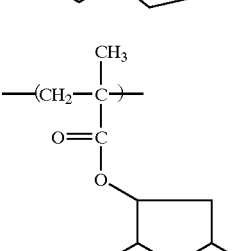

The content of repeating unit having the polycyclic-type alicyclic group represented by formula (I) in the resin of component (B) according to the present invention may be controlled while taking account of the balance among the (a6) 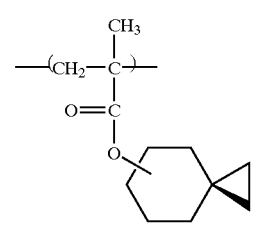
(a7) 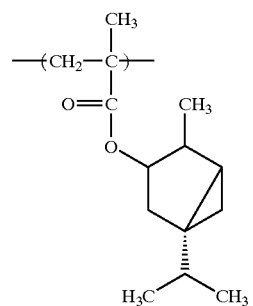
(a8) 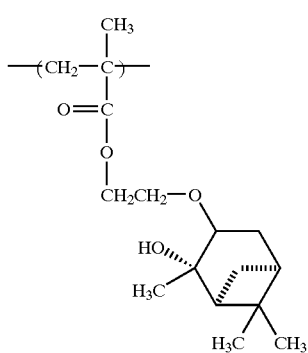
(a9) 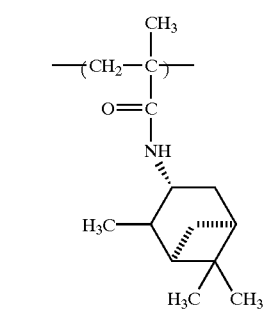
(a10) 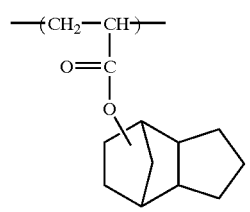
(a11) 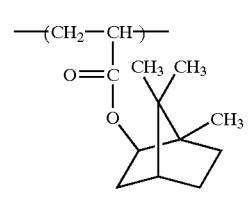
(a12) 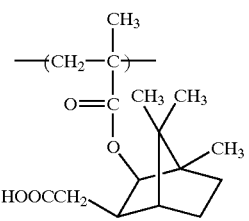
(a13) 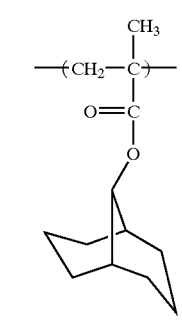
(a14) 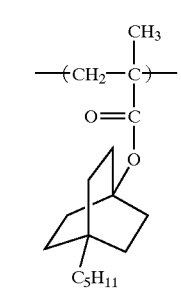
(a15) 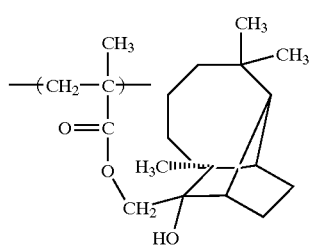
(a16) 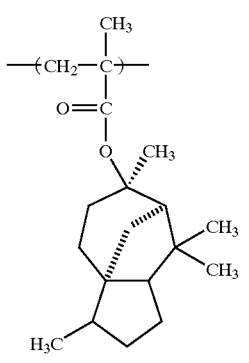

-continued
(a17)
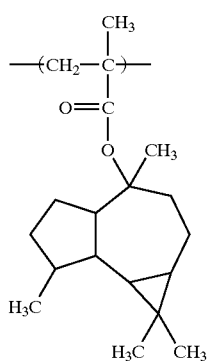
(a18)
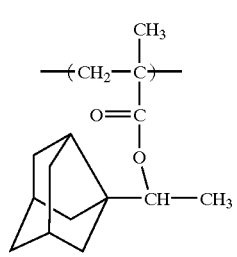
(a19)
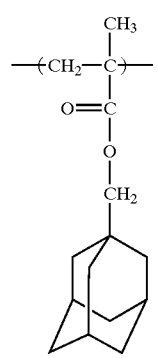
(a20)
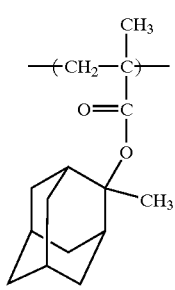
(a21)
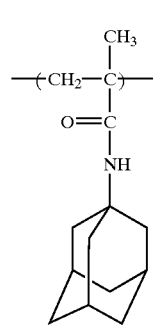
-continued
(a22)
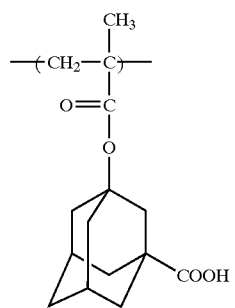
(a23)
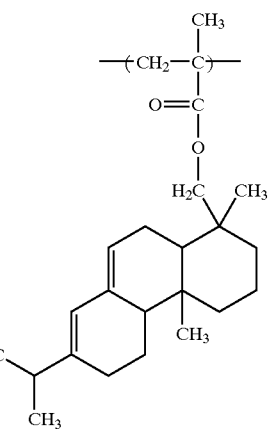
(a24)
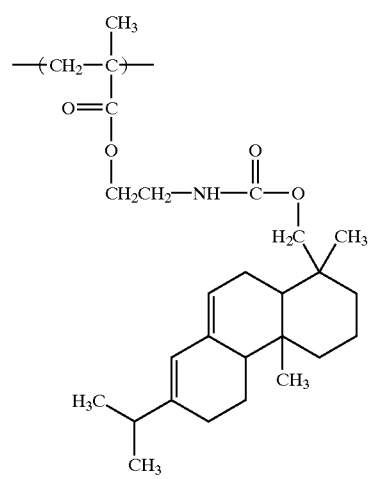
(a25)

-continued
(a26)
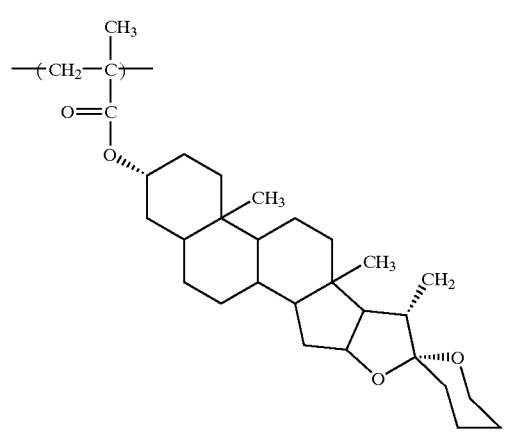
(a27)
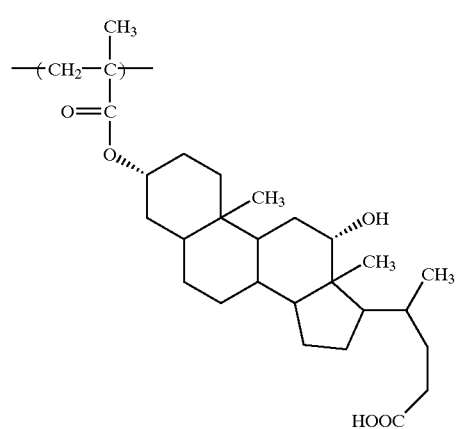
(a28)
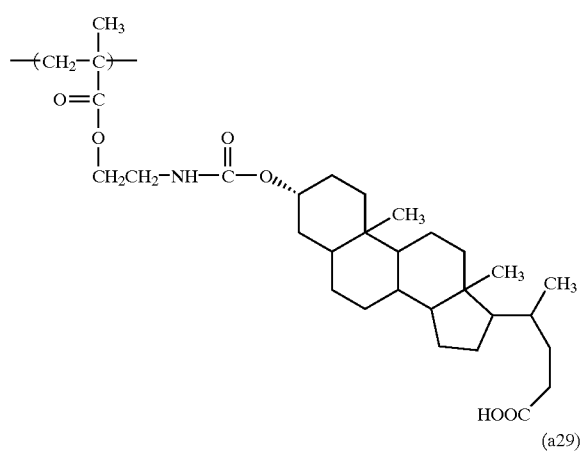
(a29)
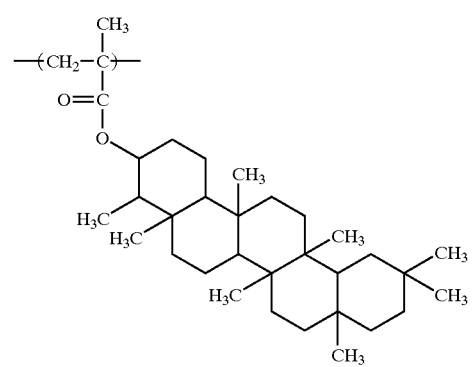
(a30)
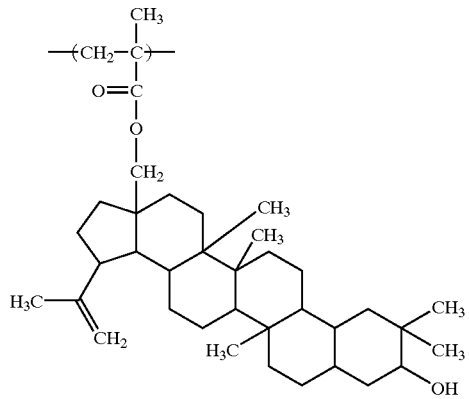
(a31)
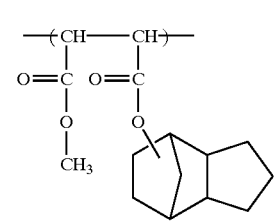
(a32)
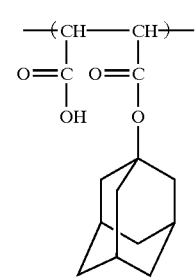
(a33)
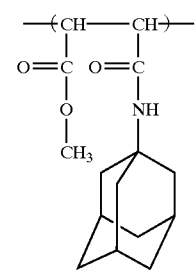
(a34)
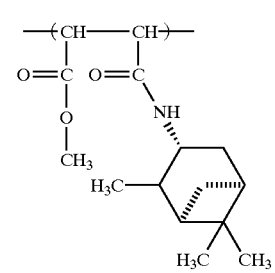

-continued (a35)
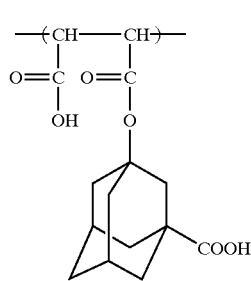

(a36)
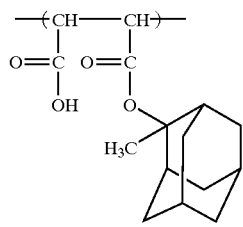

(a37)
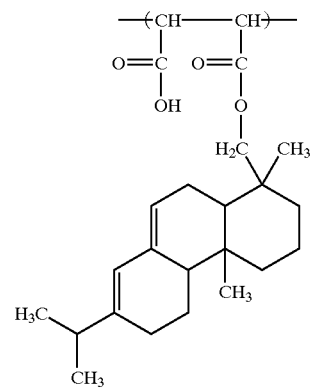

(a38)
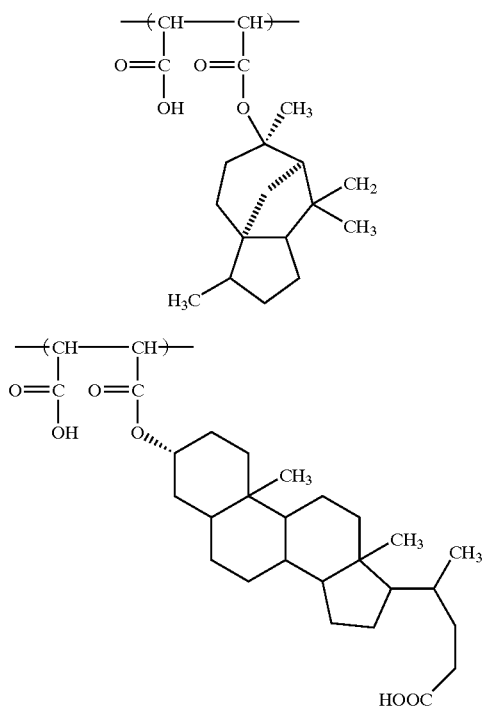

(a39)

The content of the repeating unit having a carboxy group represented by formula (IV) described above in the resin of component (B) according to the present invention is controlled while taking account of characteristics such as the developing property with alkali, adhesion to a substrate, sensitivity and the like. However, the content thereof is preferably from 0 to 20% by mole, more preferably from 1 to 15% by mole, and still more preferably from 3 to 10% by mole, based on the total repeating units.

Specific examples of the repeating unit represented by formula (IV) are set forth below, but the present invention should not be construed as being limited thereto.

(b1)
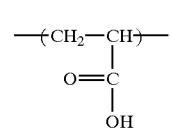

(b2)
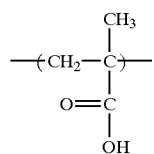

(b3)
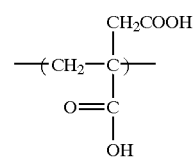

(b4)
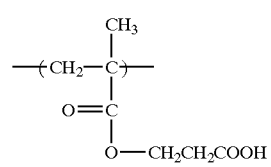

(b5)
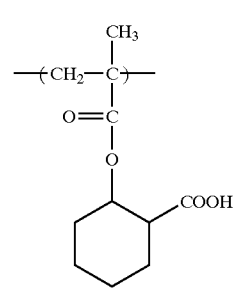

(b6)
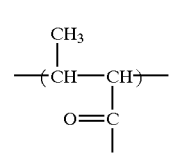

(b7)
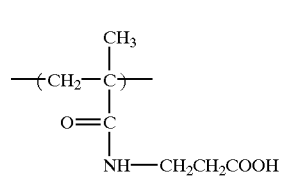

(b8) 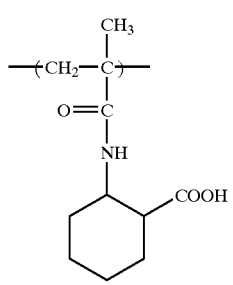

(b9) 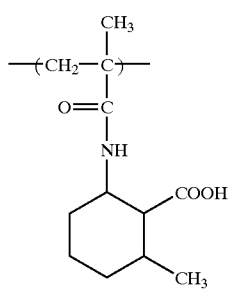

(b10) 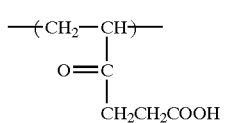

(b11) 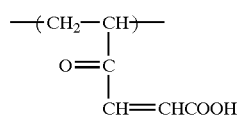

(b12) 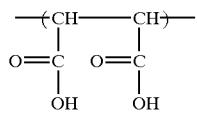

(b13) 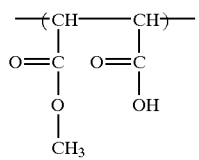

(b14) 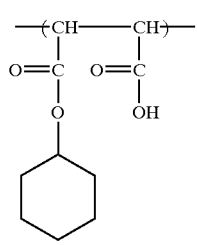

(b15) 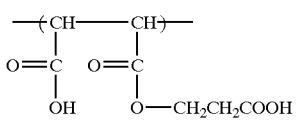

(b16) 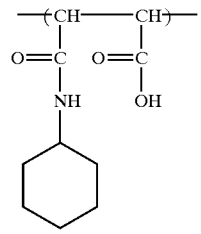

The content of the repeating unit having an acid-decomposable group represented by formula (II) described above in the resin of component (B) according to the present invention is controlled while taking account of characteristics such as the developing property with alkali, adhesion to a substrate, sensitivity and the like. However, the content thereof is preferably from 0 to 60% by mole, more preferably from 10 to 50% by mole, and still more preferably from 20 to 45% by mole, based on the total repeating units.

Specific examples of the repeating unit having an acid-decomposable group are set forth below, but the present invention should not be construed as being limited thereto.

(c1) 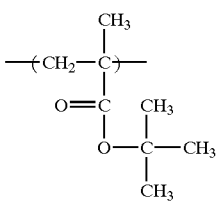

(c2) 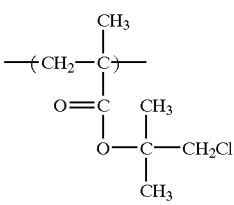

(c3) 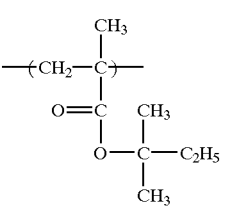

(c4) 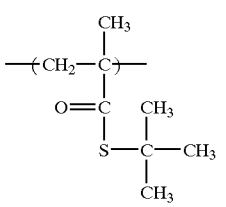

(c5) 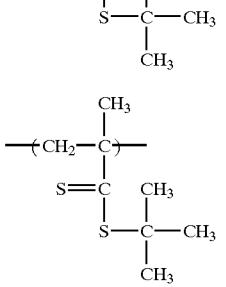

-continued (c6) poly(methacrylate) with ester of 2-cyclopropylpropan-2-ol (c7) poly(methacrylate) with ester of 2-methylbut-3-en-2-ol (c8) poly(methacrylamide) of 2-amino-cyclohexane-1-carboxylic acid tert-butyl ester (c9) poly(methacryl thioester) with S-(but-3-en-2-yl)

(c10) poly(methacrylate) with ester of 1-methylcyclohexanol (c11) poly(methacrylate) with ester of 3-oxocyclopentanol (c12) poly(methacrylate) with ester of 3-oxocyclohexanol (c13) poly(methacrylate) with ester of α-hydroxy-γ-butyrolactone (c14) poly(methacrylate) with ester of 4-methyl-4-hydroxy-tetrahydropyran-2-one (mevalonolactone)

(c15) poly(methacrylate) with ester of tetrahydropyran-2-ol (c16) poly(methacrylate) with ester of 6-methoxy-tetrahydropyran-2-ol (c17) poly(methacrylate) with —O—CH₂—OCH₃

(c18) poly(methacrylate) with —O—CH(CH₃)—OC₂H₅

(c19) poly(methacrylate) with —O—CH(CH₃)—OC₂H₄—Cl

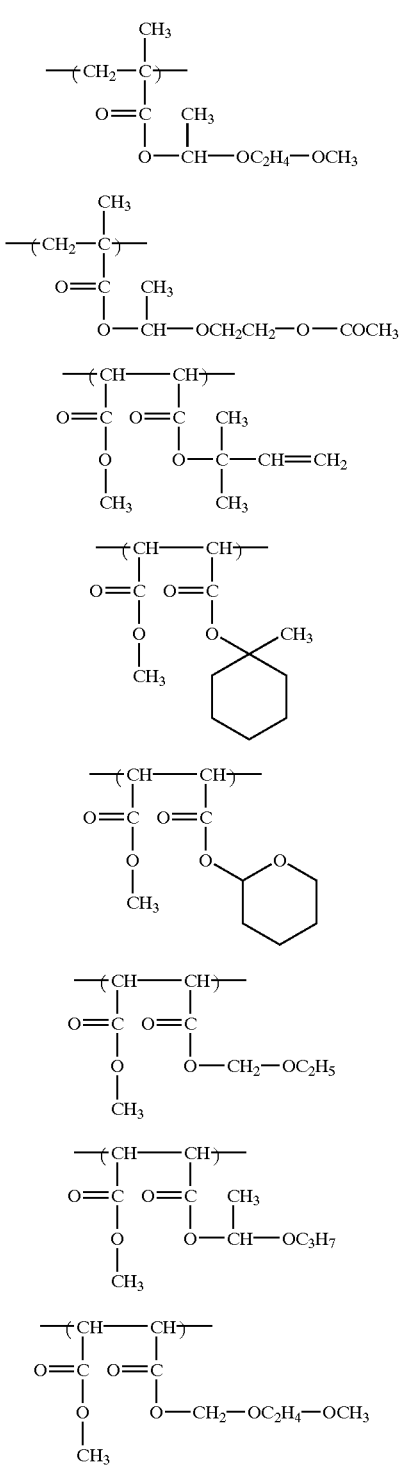

The resin of component (B) according to the present invention may further contain a repeating unit represented by formula (III) described above for the purpose of controlling various characteristics such as the dry etching resistance, film-forming property, developing property with alkali, adhesion to a substrate, sensitivity and the like. The content of the repeating unit represented by formula (III) is preferably from 0 to 30% by mole, more preferably from 0 to 25% by mole, and still more preferably from 0 to 20% by mole, based on the total repeating units.

A monomer corresponding to the repeating unit represented by formula (III) includes preferably an addition-polymerizable monomer selected, for example, from an acrylic acid ester, a methacrylic acid ester, an acrylamide, a methacrylamide, a crotonic acid ester, an itaconic acid ester, a maleic acid ester, acrylonitrile and methacrylonitrile.

Specific examples of the addition-polymerizable monomer include acrylic acid esters such as alkyl (the alkyl group preferably having from 1 to 10 carbon atoms) acrylate (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, furfuryl acrylate, or tetrahydrofurfuryl acrylate); methacrylic acid esters such as alkyl (the alkyl group preferably having from 1 to 10 carbon atoms) methacrylate (e.g., methyl methacrylate, ethyl methacrylate, propyl methacrylate, isopropyl methacrylate, tert-butyl methacrylate, amyl methacrylate, hexyl methacrylate, cyclohexyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate or tetrahydrofurfuryl methacrylate); acrylamides such as acrylamide, an N-alkylacrylamide (the alkyl group being an alkyl group having from 1 to 10 carbon atoms, for example, methyl group, ethyl group, propyl group, butyl group, tert-butyl group, heptyl group, octyl group, cyclohexyl group, benzyl group, hydroxyethyl group or benzyl group), an N,N-dialkylacrylamide (the alkyl group being an alkyl group having from 1 to 10 carbon atoms, for example, methyl group, ethyl group, butyl group, isobutyl group, ethylhexyl group or cyclohexyl group), N-hydroxyethyl-N-methylacrylamide and N-2-acetamidoethyl-N-acetylacrylamide; methacrylamides such as methacrylamide, an N-alkylmethacrylamide (the alkyl group being an alkyl group having from 1 to 10 carbon atoms, for example, methyl group, ethyl group, tert-butyl group, ethylhexyl group, hydroxyethyl group or cyclohexyl group), an N,N-dialkylmethacrylamide (the alkyl group being, for example, ethyl group, propyl group or butyl group) and N-hydroxyethyl-N-methylmethacrylamide; crotonic acid esters such as an alkyl crotonate (e.g., butyl crotonate, hexyl crotonate, or glycerol monocrotonate); dialkyl itaconates (e.g., dimethyl itaconate, diethyl itaconate, or dibutyl itaconate); dialkyl esters of a maleic acid or fumaric acid (e.g., dimethyl maleate, or dibutyl fumarate); maleic anhydride; maleimide; acrylonitrile; methacrylonitrile; and maleonitrile.

The resin of component (B) according to the present invention has a molecular weight, in terms of a weight average molecular weight (Mw: polystyrene basis), of 2,000 or more, preferably from 3,000 to 1,000,000, more preferably from 5,000 to 200,000, and still more preferably from 20,000 to 150,000. As the molecular weight is larger, the heat resistance or the like is more improved, however, the developing property or the like deteriorates. Therefore, the molecular weight is controlled in a preferred range taking account of the balance of these characteristics.

In the present invention, the amount of the resin of component (B) added to the resist composition is from 50 to 99.7% by weight, preferably from 70 to 99% by weight, based on the whole solid content.

Now, the compound of component (A) which can be used in the resist composition according to the present invention will be described in more detail below.

The compound of component (A) for use in the present invention is a photo-acid generator which generates an acid upon irradiation with an actinic ray or radiation.

The compound which decomposes on irradiation with an actinic ray or radiation to generate an acid for use in the present invention can be appropriately selected from photo initiators for photo-cation polymerization, photoinitiators for photo-radical polymerization, photo-achromatizing agents of dyes, photo-discoloring agents, known compounds used in a microresist or the like, which generate an acid by light (ultraviolet ray or far ultraviolet ray of from 200 to 400 nm, particularly preferably, g-line, h-line, i-line, KrF excimer laser beam), an ArF excimer laser beam, an electron beam, an X ray, a molecular beam or an ion beam, and a mixture of these compounds.

Other examples of the compound generating an acid on irradiation of an actinic ray or radiation for use in the present invention include diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069,055, 4,069,056 and Re 27,992 and JP-A-3-140140, phosphonium salts described in D. C. Necker et al., *Macromolecules*, 17, 2468 (1984), C. S. Wen et al., *Teh, Proc. Conf. Rad. Curing ASIA*, p. 478, Tokyo, Oct. (1988) and U.S. Pat. Nos. 4,069,055 and 4,069,056, iodonium salts described in J. V. Crivello et al., *Macromolecules*, 10(6), 1307 (1977), *Chem. & Eng. News*, Nov. 28, p. 31 (1988), European Patents 104,143, 339,049 and 410,201, JP-A-2-150848 and JP-A-2-296514, sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci., Polymer Chem. Ed.*, 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patents 2,904,626, 3,604,580 and 3,604,581, JP-A-7-28237 and JP-A-8-27102, selenonium salts described in J. V. Crivello et al., *Macromolecules*, 10(6), 1307 (1977), and J. V. Crivello et al., *J. Polymer Sci. Polymer Chem. Ed.*, 17, 1047 (1979), onium salts such as arsonium salt described in C. S. Wen et al., *Teh. Proc. Conf. Rad. Curing ASIA*, p. 478, Tokyo, October (1988), organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metals/organic halides described in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896) and JP-A-2-161445, photo-acid generators having an o-nitrobenzyl type protective group, described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130(6), F. M. Houlihan et al., *Macromolecules*, 21, 2001 (1988), European Patents 290,750, 046,083, 156,535, 271,851 and 388,343, U.S. Pat. Nos. 3,901,710 and 4,181,531, JP-A-60-198538 and JP-A-53-133022, compounds which photolyze and generate a sulfonic acid, represented by iminosulfonates and the like and described in M. Tunooka et al., *Polymer Preprints Japan*, 35(8), G. Berner et al., *J. Rad. Curing*, 13(4), W. J. Mijs et al., *Coating Technol.*, 55(697), 45 (1983) Akzo, H. Adachi et al., *Polymer Preprints, Japan*, 37(3), European Patents 199,672, 084,515, 044,115, 618, 564 and 101,122, U.S. Pat. Nos. 4,371,605 and 4,431,774, JP-A-64-18143, JP-A-2-245756 and JP-A-3-140109, disulfone compounds described in JP-A-61-166544 and JP-A-2-71270, and diazoketosulfone and diazodisulfone compounds described in JP-A-3-103854, JP-A-3-103856 and JP-A-4-210960.

Furthermore, polymer compounds having the group or compound generating an acid by light introduced into the main or side chain thereof may also be used and examples thereof include compounds described in M. E. Woodhouse et al., *J. Am. Chem. Soc.*, 104, 5586 (1982), S. P. Pappas et al., *J. Imaging Sci.*, 30(5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Also, compounds which generate an acid by light described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may be used.

Among the above-described compounds which decompose on irradiation of an actinic ray or radiation and generate an acid, those which can be particularly effectively used are described below.

(1) Oxazole derivative represented by formula (PAG1) shown below or s-triazine derivative represented by formula (PAG2) shown below, substituted with trihalomethyl group:

(PAG1)

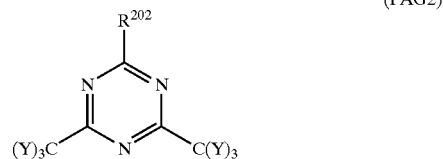
(PAG2)

wherein $R^{201}$ represents a substituted or unsubstituted aryl group or alkenyl group, $R^{202}$ represents a substituted or unsubstituted aryl group, alkenyl group or alkyl group, or $-C(Y)_3$, and Y represents a chlorine atom or a bromine atom.

Specific examples thereof include the following compounds, however, the present invention should not be construed as being limited thereto.

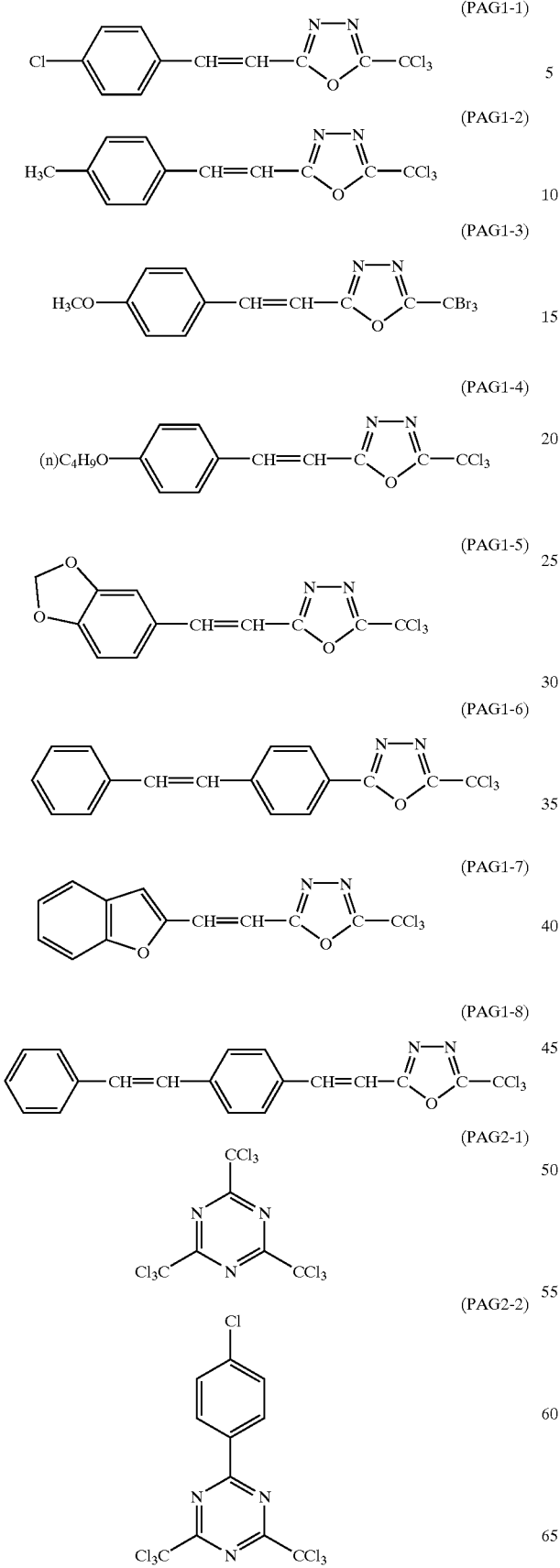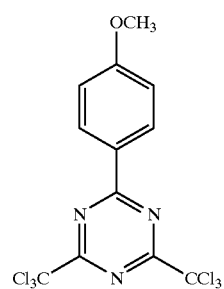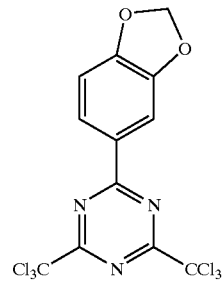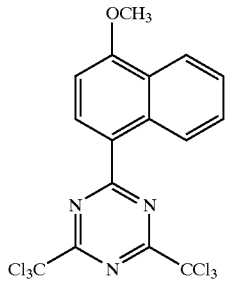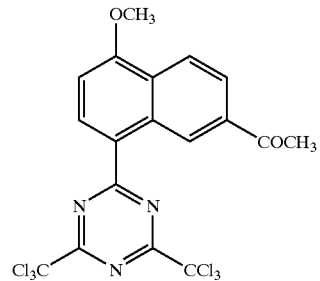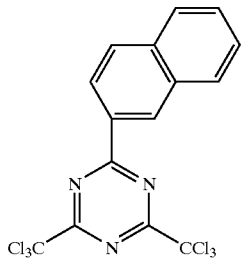

(PAG2-8)

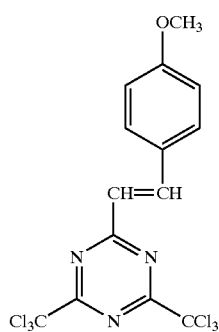

(PAG2-9)

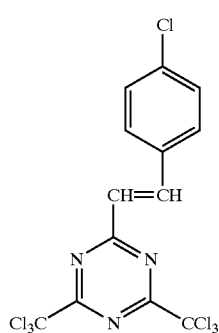

(PAG2-10)

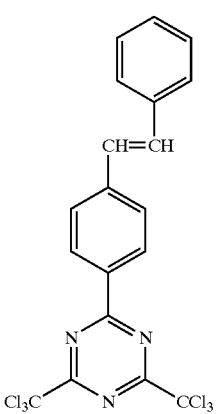

(2) Iodonium salt represented by formula (PAG3) shown below or sulfonium salt represented by formula (PAG4) shown below:

(PAG3)

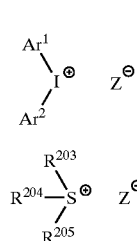

(PAG4)

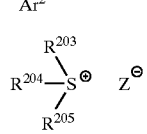

wherein $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

$R^{203}$, $R^{204}$ and $R^{205}$ each independently represents a substituted or unsubstituted alkyl group or aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxy group, a hydroxy group and a halogen atom, and for the alkyl group, an alkoxy group having from 1 to 8 carbon atoms, a carboxy group and an alkoxycarbonyl group.

$Z^-$ represents a counter anion and examples thereof include a perfluoroalkane sulfonate anion such as $BF_4^-$, $AsF_6^-$, $PF_6^-$, $SbF_6^-$, $SiF_6^{2-}$, $ClO_4^-$ and $CF_3SO_3^-$, pentafluorobenzene sulfonate anion, a condensed polynuclear aromatic sulfonate anion such as naphthalene-1-sulfonate anion, anthraquinone sulfonate anion, and a sulfonic acid group-containing dye, however, the present invention should not be construed as being limited thereto.

Two of $R^{203}$, $R^{204}$ and $R^{205}$ or $Ar^1$ and $Ar^2$ may be combined through a single bond or a substituent.

Specific examples thereof include the following compounds, however, the present invention should not be construed as being limited thereto.

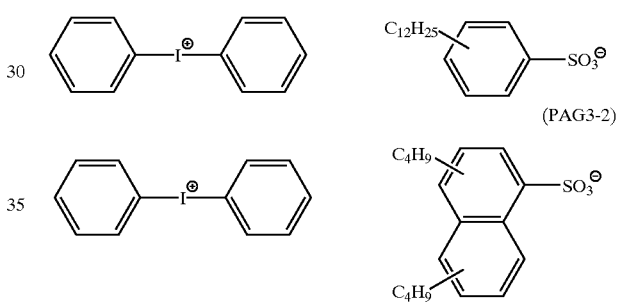

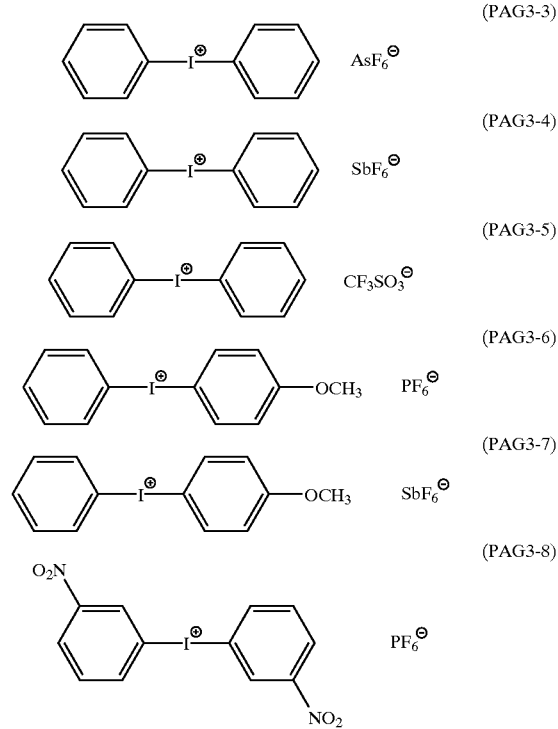

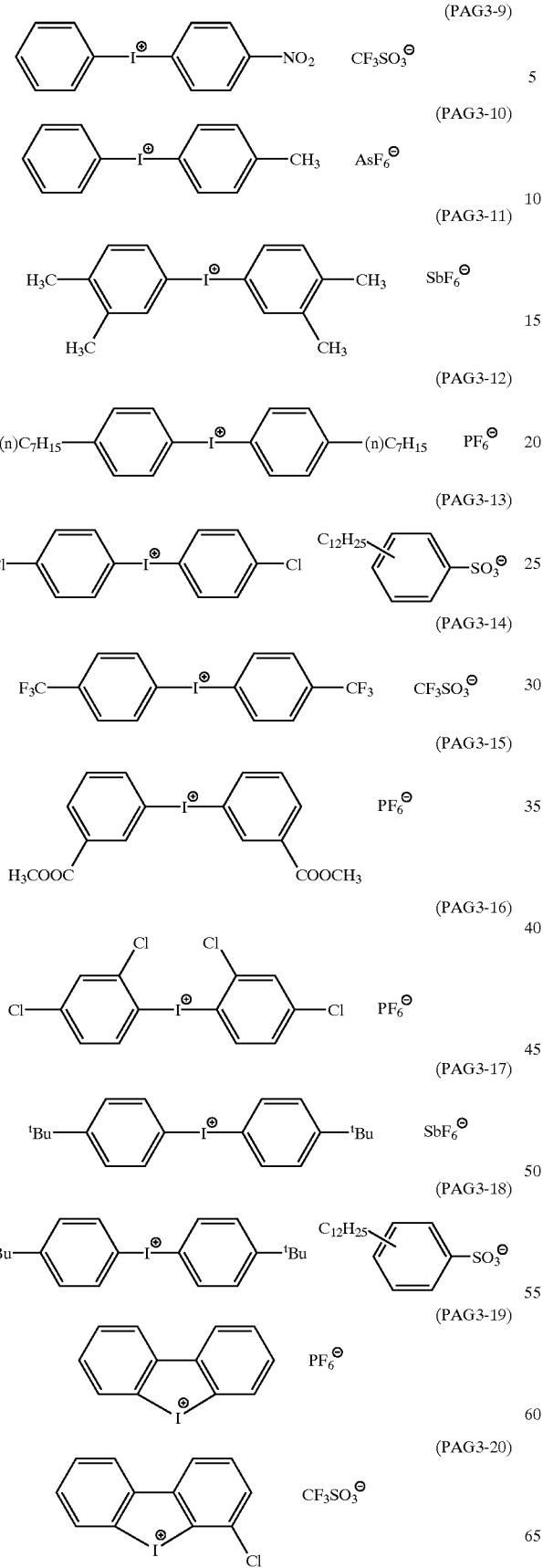
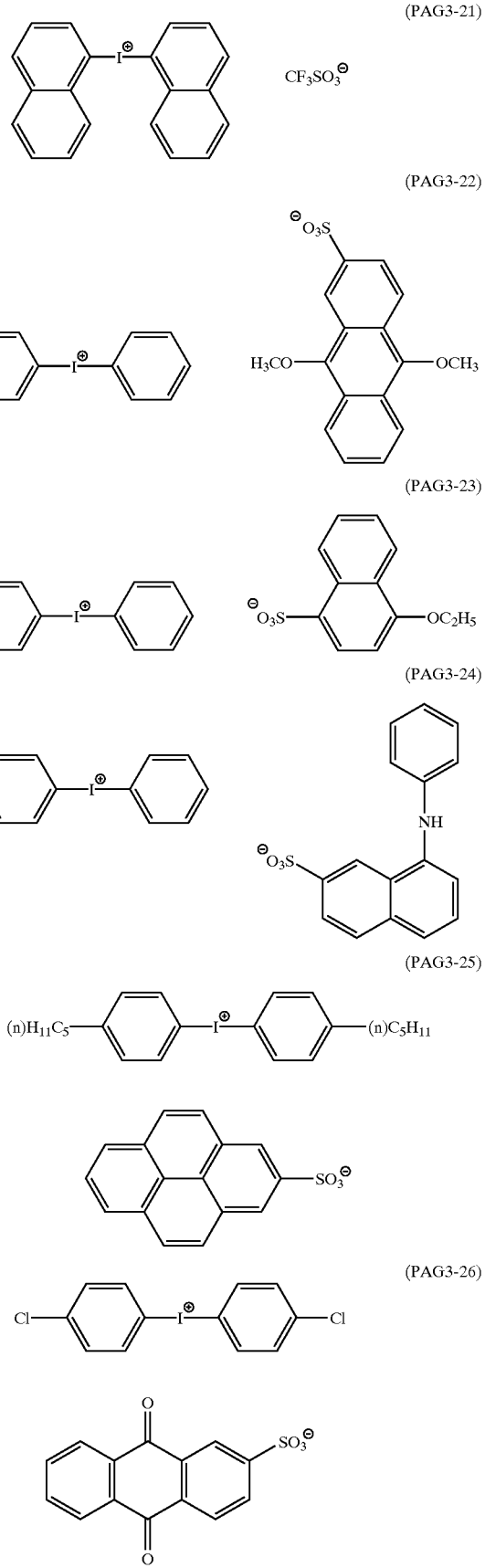

(PAG3-27), (PAG4-1) through (PAG4-18): chemical structures of photoacid generators.

-continued (PAG4-19)
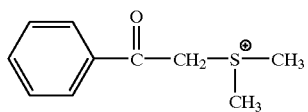

(PAG4-20)
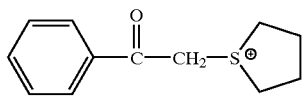

(PAG4-21)
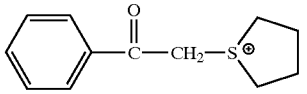

(PAG4-22)
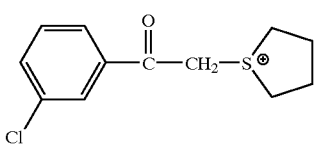

(PAG4-23)
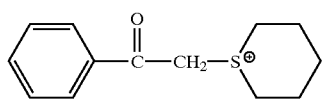

(PAG4-24)
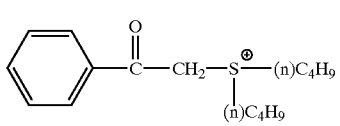

(PAG4-25)
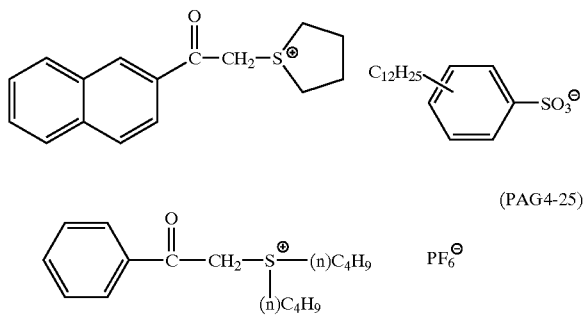

(PAG4-26)

(PAG4-27)
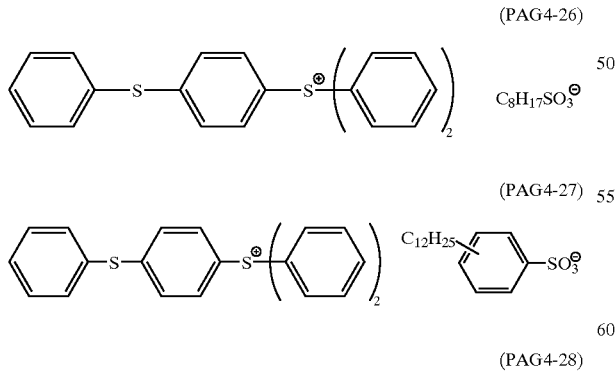

(PAG4-28)
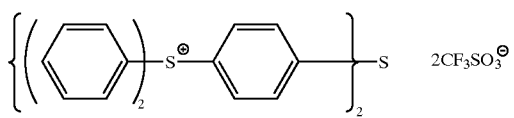

-continued (PAG4-29)
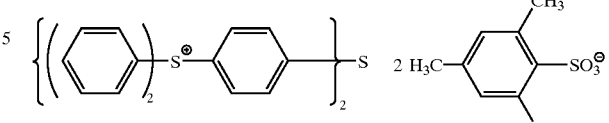

(PAG4-30)
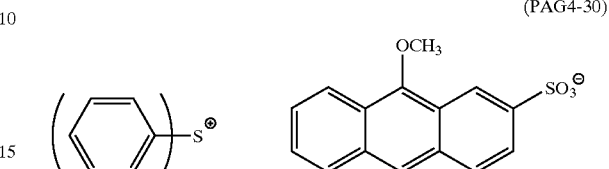

(PAG4-31)
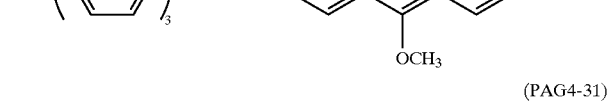

(PAG4-32)
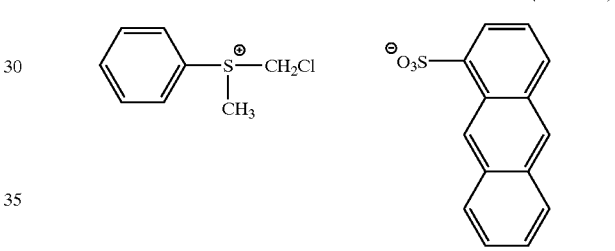

(PAG4-33)
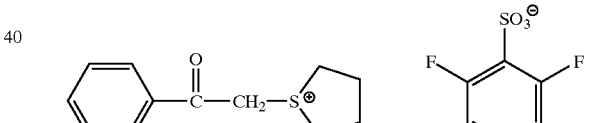

(PAG4-34)
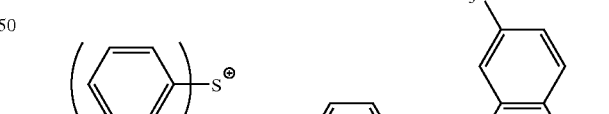

The onium salts represented by formulae (PAG3) and (PAG4) are known and can be synthesized by the methods described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivative represented by formula (PAG5) shown below or iminosulfonate derivative represented by formula (PAG6) shown below:

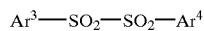
(PAG5)

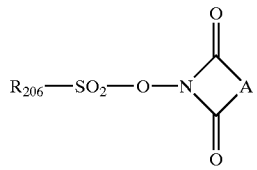
(PAG6)

wherein $Ar^3$ and $Ar^4$ each independently represents a substituted or unsubstituted aryl group, $R^{206}$ represents a substituted or unsubstituted alkyl group or aryl group, and A represents a substituted or unsubstituted alkylene group, alkenylene group or arylene group.

Specific examples thereof include the following compounds, however, the present invention should not be construed as being limited thereto.

(PAG5-1)
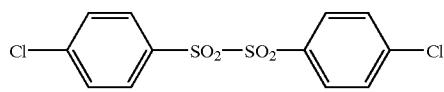

(PAG5-2)
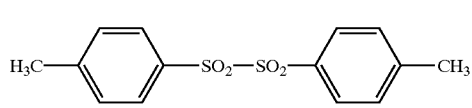

(PAG5-3)
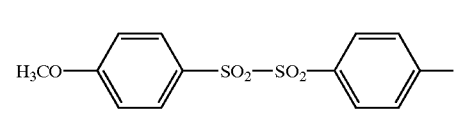

(PAG5-4)
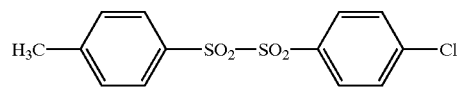

(PAG5-5)
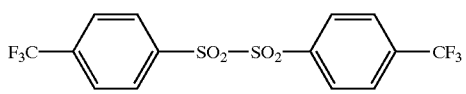

(PAG5-6)
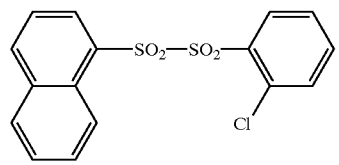

(PAG5-7)
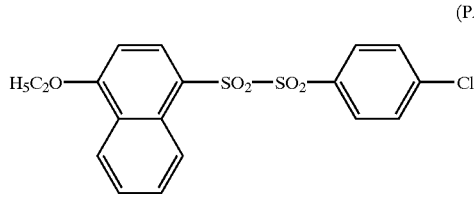

(PAG5-8)
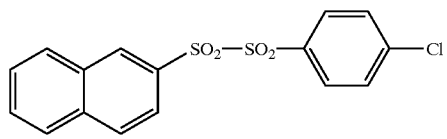

(PAG5-9)
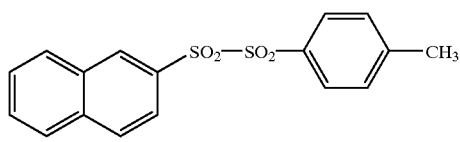

(PAG5-10)
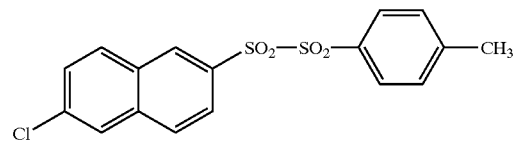

(PAG5-11)
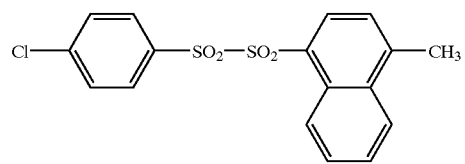

(PAG5-12)
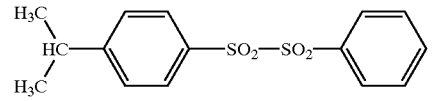

(PAG5-13)
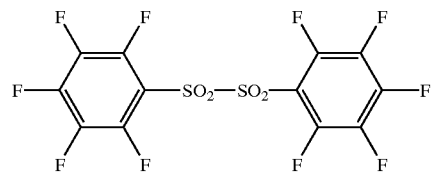

(PAG5-14)
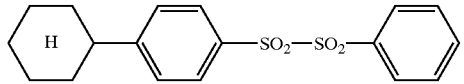

(PAG5-15)
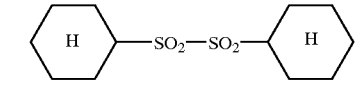

(PAG6-1)
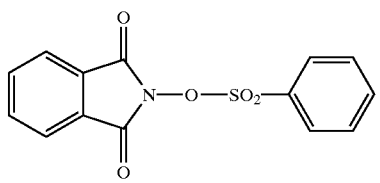

(PAG6-2)
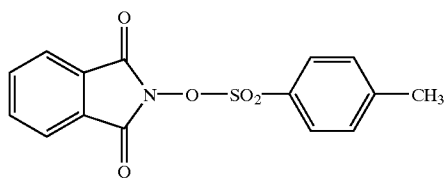

-continued (PAG6-3) (PAG6-4) (PAG6-5) (PAG6-6) (PAG6-7) (PAG6-8) (PAG6-9) (PAG6-10)

(PAG6-11) (PAG6-12) (PAG6-13) (PAG6-14) (PAG6-15) (PAG6-16) (PAG6-17) (PAG6-18)

-continued (PAG6-19)

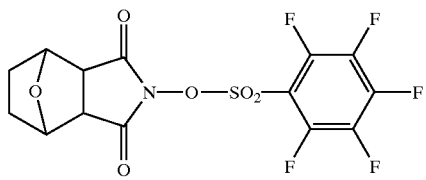

The amount of the compound which decomposes on irradiation of an actinic ray or radiation and generates an acid to be used is usually from 0.001 to 40% by weight, preferably from 0.01 to 20% by weight, more preferably from 0.1 to 5% by weight, based on the whole weight of the photosensitive composition (excluding the solvent). If the amount added of the compound which decomposes on irradiation of an actinic ray or radiation and generates an acid is less than 0.001% by weight, the sensitivity is reduced, whereas if the amount added exceeds 40% by weight, the resist exhibits too much light absorption, resulting in causing disadvantageous effects such as deterioration of profile or narrow process (particularly bake) margin.

The positive resist composition of the present invention preferably contains a low molecular weight acid-decomposable dissolution inhibiting compound solubility of which in an alkaline developing solution increases by the action of an acid and which has a group capable of being decomposed by the action of an acid and a molecular weight of 3,000 or less. Due to the incorporation of the compound, further improvements in the resolution, dry etching resistance and adhesion to a substrate can be achieved.

The acid-decomposable dissolution inhibiting compound for use in the present invention preferably includes a low molecular weight compound containing at least one acid-decomposable group represented by formula (VI) or (VII) and having a molecular weight of 3,000 or less. In order to prevent reduction in the transmittance of light, particularly light having a wavelength of 220 nm or less, an alicyclic or aliphatic compound such as a cholic acid derivative described in *Proceeding of SPIE*, 2724, 355 (1996) is preferred. When the acid-decomposable dissolution inhibiting compound is used in the present invention, the amount added thereof is from 3 to 50% by weight, preferably from 5 to 40% by weight, more preferably from 10 to 35% by weight, based on the whole weight of the resist composition (excluding the solvent).

Other components for use in the resist composition according to the present invention:

The positive resist composition of the present invention may further contain, if desired, a dye, a plasticizer, a surface active agent, a photosensitizer, an organic basic compound, a compound which accelerates solubility in a developing solution, and the like.

The compound for accelerating the dissolution in a developing solution, which can be used in the present invention, is a low molecular weight compound containing two or more phenolic OH groups or one or more carboxy group and having a molecular weight of 1,000 or less. In the case where the compound contains a carboxy group, an alicyclic or aliphatic compound is preferred for the same reason as described above.

The amount of the dissolution accelerating compound added is preferably from 2 to 50% by weight, more preferably from 5 to 30% by weight, based on the resin according to the present invention. If the amount added exceeds 50 wt %, development residue increases adversely or a new problem disadvantageously arises such that the pattern deforms at the development.

The above-described phenol compound having a molecular weight of 1,000 or less can be easily synthesized by one skilled in the art making reference to the methods described, for example, in JP-A-4-122938, JP-A-2-28531, U.S. Pat. No. 4,916,210 and European Patent 219,294.

Specific examples of the phenol compound are described below, however, the compounds which can be used in the present invention should not be construed as being limited thereto.

Resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucocide, 2,4,2',4'-biphenyltetrol, 4,4'-thiobis(1,3-dihydroxy)benzene, 2,2',4,4'-tetrahydroxy-diphenyl ether, 2,2',4,4'-tetrahydroxydiphenyl sulfoxide, 2,2',4,4'-tetrahydroxydiphenylsulfone, tris(4-hydroxy-phenyl)methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)-hexane, 1,2-tetrakis(4-hydroxyphenyl)ethane, 1,1,3-tris(hydroxyphenyl)butane and para[α,α,α',α'-tetrakis(4-hydroxyphenyl)]xylene.

The organic basic compound which can be used in the present invention is preferably a compound having basicity stronger than the phenol, more preferably a nitrogen-containing basic compound.

The preferred chemical environment thereof contains the following structures (A) to (E):

(A)

wherein $R^{250}$ $R^{251}$ and $R^{252}$ which may be the same or different, each independently represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may combine with each other to form a ring;

(B)

(C)

(D)

(E)

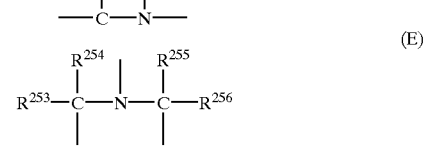

wherein $R^{253}$, $R^{254}$, $R^{255}$ and $R^{256}$, which may be the same or different, each represents an alkyl group having from 1 to 6 carbon atoms.

More preferred is a nitrogen-containing basic compound containing two or more nitrogen atoms of different chemical environments in one molecule, still more preferred is a compound containing both a substituted or unsubstituted amino group and a ring structure having a nitrogen atom, or a compound having an alkylamino group. Preferred specific examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group. More preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-amino-ethylpyridine, 4-aminoethylpyridine, 3-aminopyrrolidine, piperazine, N-(2-aminoethyl)piperazine, N-(2-aminoethyl)-piperidine, 4-amino-2,2,6,6-tetramethylpiperidine, 4-piperidinopiperidine, 2-iminopiperidine, 1-(2-aminoethyl)-pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, the present invention should not be construed as being limited thereto.

The nitrogen-containing basic compounds are used individually or in combination of two or more thereof. The amount of the nitrogen-containing basic compound used is usually from 0.001 to 10 parts by weight, preferably from 0.01 to 5 parts by weight, par 100 parts by weight of the photosensitive composition excluding the solvent. If the amount used is less than 0.001 part by weight, the effect owing to the addition of the nitrogen-containing basic compound may not be obtained, whereas if it exceeds 10 parts by weight, reduction in the sensitivity or deterioration in the developing property of the unexposed area is liable to occur.

Suitable dyes include an oil dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are manufactured by Orient Chemical Industries Co., Ltd.), Crystal Violet (CI42555), Methyl Violet (CI42535), Rhodamine B (CI45170B), Malachite Green (CI42000) and Methylene Blue (CI52015).

In order to improve acid generation ratio on exposure, a photosensitizer may be added. Specific examples of suitable photosensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, the present invention should not be construed as being limited thereto.

The photosensitizer may also be used as a light absorbent of far ultraviolet ray from a light source. In such a case, the absorbent reduces reflected light from a substrate and decreases the influence of multiple reflection in the resist layer, thereby exerting the effect of improving the standing wave.

The photosensitive composition of the present invention is dissolved in a solvent which can dissolve the above-described respective components, and then coated on a substrate. The solvent used is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. The solvents are used individually or in combination of two or more thereof.

To the solvent, a surface active agent may be added. Specific examples thereof include a nonionic surface active agent, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; a fluorine-base surface active agent such as F-top EF301, EF303 and EF352 (manufactured by Shin Akita Chemical Co., Ltd.), Megafac F171 and F173 (manufactured by Dainippon Ink and Chemicals, Inc.), Florad FC430 and FC431 (manufactured by Sumitomo 3M Ltd.), Asahiguard AG710, Surflon S-382, SC101, SC102, SC103, SC104, SC105 and SC-106 (manufactured by Asahi Glass Co., Ltd.), organosiloxane polymer KP-341 (manufactured by Shin-Etsu Chemical Co., Ltd.), and acrylic acid-base or methacrylic acid-base (co) polymer Polyflow No. 75 and No. 95 (manufactured by Kyoeisha Yushi Kagaku Kogyo Co., Ltd.). The amount of the surface active agent added is ordinarily 2 parts by weight or less, preferably 1 part by weight or less, per 100 parts by weight of the solid content in the photosensitive composition according to the present invention.

The surface active agents may be used individually or in combination of two or more thereof.

The above-described photosensitive composition is coated on a substrate (e.g., silicon/silicon dioxide coating) for use in the production of a precision integrated circuit element by an appropriate coating means such as spinner or coater, exposed through a predetermined mask, baked and developed to thereby obtain a good resist pattern.

The exposure light is preferably a far ultraviolet ray having a wavelength of 250 nm or less, more preferably 220 nm or less. Specific examples thereof include KrF excimer laser (248 nm), ArF excimer laser (193 nm), $F_2$ excimer laser (157 nm), an X ray and an electron beam.

A developing solution which can be used for the photosensitive composition according to the present invention is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, and a cyclic amine such as pyrrole and piperidine.

To the alkaline aqueous solution, an appropriate amount of an alcohol or surface active agent may be added.

The present invention will be described in greater detail with reference to the following examples, however, the present invention should not be construed as being limited thereto.

SYNTHESIS EXAMPLE 1

Synthesis of Resin (p-1) of the Present Invention

In 60 ml of 1-methoxy-2-propanol, 13.2 g (0.060 mol) of tricyclodecanyl methacrylate, 2.8 g (0.020 mol) of tert-butyl methacrylate and 1.7 g (0.020 mol) of methacrylic acid were dissolved. To the solution was added 100 mg of 2',2'-azobis (2,4-dimethylvaleronitrile) (V-65 manufactured by Wako Pure Chemical Industries, Ltd.) as a polymerization initiator at 70° C. under a nitrogen gas stream with stirring. Two hours and four hours after the initiation of the reaction, each 100 mg of the same polymerization initiator as described above was added, followed by reacting for 3 hours. The temperature of the solution was raised to 90° C. and continued to stir for one hour. The reaction solution was allowed to cool and poured with vigorously stirring into one liter of a mixture of ion exchanged water and methanol (2/1) to deposit a polymer. The polymer was dried at 40° C. under a reduced pressure to obtain 16.3 g of a white resin. A weight average molecular weight of the polymer measured by GPC and calculated in terms of polystyrene was $16.5 \times 10^3$ and a degree of dispersion (Mw/Mn) thereof was 2.5.

The polymer thus-obtained was dissolved in 80 ml of propylene glycol monomethyl ether acetate (PGMEA), the resulting solution was heated to 60° C. and then a pressure of the system was gradually reduced to 20 mmHg, thereby removing PGMEA and water in the system by azeotropic distillation. After the azeotropic distillation, the solution was cooled to 20° C., 0.20 g of divinyl ether of 1,4-cyclohexanedimethanol (Compound (d7) described hereinbefore) was added thereto and then 3 mg of p-toluenesulfonic acid was added thereto. The reaction was conducted for 2 hours and the acid was neutralized by adding a small amount of triethylamine. To the reaction solution was added ethyl acetate and the mixture was washed with ion exchanged water to remove the salt. The ethyl acetate was distilled off under a reduced pressure from the reaction solution to obtain a PGMEA solution of Resin (p-1) of the present invention in which cross-linkage was partially introduced.

SYNTHESIS EXAMPLES 2 TO 10

Synthesis of Resins (p-2) to (p-10) of the Present Invention

In the same manner as described in Synthesis Example 1, Resins (p-2) to (p-10) were synthesized using raw material monomers corresponding to the repeating units and the vinyl ether compounds shown in Table 1 below, respectively. The molar ratio of the raw material monomers corresponding to the repeating units used at the preparation and the weight average molecular weight and degree of dispersion of the resin obtained are also shown in Table 1.

TABLE 1

Synthesis of Resin of the Present Invention

| Synthesis Example | Resin of the Present Invention | Repeating Units (molar ratio) | Vinyl Ether Compound | Weight Average Molecular Weight (degree of dispersion) |
|---|---|---|---|---|
| 2 | (p-2) | (a11)/(b2)/(c6)/ Acrylonitrile (50/10/25/15) | (d7) | $74.6 \times 10^3$ (6.8) |
| 3 | (p-3) | (a16)/(b4)/(c1) (50/20/30) | (d5) | $88.4 \times 10^3$ (8.5) |
| 4 | (p-4) | (a20)/(b2)/(c14) (50/10/40) | (d7) | $79.5 \times 10^3$ (7.4) |
| 5 | (p-5) | (a20)/(bl)/(c12) (50/15/35) | (d12) | $94.1 \times 10^3$ (9.4) |
| 6 | (p-6) | (a25)/(b7)/(c12)/ Acrylonitrile (50/10/30/10) | (d7) | $83.5 \times 10^3$ (8.3) |
| 7 | (p-7) | (a10)/(b1)/(c15) (50/15/35) | (d7) | $69.4 \times 10^3$ (6.6) |
| 8 | (p-8) | (a13)/(b1)/(c14)/ Acrylonitrile (50/10/25/15) | (d2) | $78.3 \times 10^3$ (7.7) |
| 9 | (p-9) | (a19)/(b6)/(c10)/ Acrylonitrile (50/10/25/15) | (d5) | $85.5 \times 10^3$ (8.3) |
| 10 | (p-10) | (a20)/(a27)/(b2)/ (c14) (40/10/10/40) | (d7) | $91.7 \times 10^3$ (8.6) |

In each of Resins (p-1) to (p-10) synthesized above, the content of cross-linked component was one % by mole based on the total repeating units.

EXAMPLE 1

Measurement of Optical Density

In 4.5 g of propylene glycol monomethyl ether acetate, 1.0 g of the resin of component (B) obtained in the synthesis example described above according to the present invention and 0.03 g of triphenylsulfonium triflate were dissolved, and the resulting solution was filtered through a Teflon filter of 0.1 μm. The solution was uniformly coated on a quartz glass substrate by a spin coater and died by heating on a hot plate at 100° C. for 90 seconds to form a resist film having a thickness of 1 μm. Optical absorption of the resulting film was measured by an ultraviolet spectrophotometer. The optical density at 193 nm is shown in Table 2 below.

TABLE 2

Results of Optical Density Measurement of Resin of the Present Invention

| Resin of the Present Invention | Optical Density at 193 nm (/μm) |
| --- | --- |
| p-1 | 0.37 |
| p-2 | 0.40 |
| p-3 | 0.38 |
| p-4 | 0.38 |
| p-5 | 0.39 |
| p-6 | 0.42 |
| p-7 | 0.37 |
| p-8 | 0.39 |
| p-9 | 0.40 |
| p-10 | 0.36 |
| Poly(hydroxystyrene) (Comparison) | 1.5 or more |

It can be seen from the results shown in Table 2 that the optical density value measured of each of the resins according to the present invention is smaller than the value of poly(hydroxystyrene) (weight-average molecular weight: 11,000) for comparison and the resins have sufficiently high transmittance to the light of 193 nm.

EXAMPLE 2

Measurement of Dry Etching Resistance

In 4.5 g of propylene glycol monomethyl ether acetate, 1.0 g of the resin of component (B) obtained in the synthesis example described above according to the present invention was dissolved, and the resulting solution was filtered through a Teflon filter of 0.1 μm. The solution was uniformly coated on a quartz glass substrate by a spin coater and died by heating on a hot plate at 130° C. for 90 seconds to form a resist film having a thickness of 0.7 μm. With the film obtained an etching rate of $CF_4/O_2$ (8/2) gas was measured using a reactive ion etching apparatus (CSE-1110 manufactured by ULVAC) under the etching conditions of power of 500 W, pressure of 4.6 Pa and gas flow rate of 10 sccm. The results obtained are shown in Table 3 below.

TABLE 3

Results of Dry Etching Resistance Measurement, of Resin of the Present Invention

| Resin of the Present Invention | Etching Rate (Å/min) |
| --- | --- |
| (p-1) | 710 |
| (p-2) | 680 |
| (p-3) | 690 |
| (p-4) | 650 |
| (p-5) | 670 |
| (p-6) | 730 |
| (p-7) | 750 |
| (p-8) | 710 |
| (p-9) | 690 |
| (p-10) | 640 |
| Poly(methyl methacrylate) (Comparison) | 1250 |

It can be seen from the results shown in Table 3 that the etching rate of each of the resins according to the present invention is smaller than that of poly(methyl methacrylate) (weight average molecular weight: 45,000) for comparison and have a sufficiently high dry etching resistance.

EXAMPLE 3

Evaluation of Image

In 4.5 g of propylene glycol monomethyl ether acetate, 1.0 g of the resin of component (B) obtained in the synthesis example described above according to the present invention and 0.03 g of triphenylsulfonium triflate were dissolved, and the resulting solution was filtered through a Teflon filter of 0.1 μm. The solution was uniformly coated on a silicon substrate which had been subjected to hexamethyldisilazane treatment by a spin coater and died by heating on a hot plate at 130° C. for 90 seconds to form a resist film having a thickness of 0.5 Am. The resist film was subjected to pattern exposure using ArF excimer laser stepper (NA: 0.55; wavelength: 193 nm) and heated on a hot plate at 120° C. for 90 seconds immediately after the exposure. Then the resist film was developed by immersing it in a 2.38% aqueous tetramethylammonium hydroxide solution at 23° C. for 60 seconds, rinsed with pure water for 30 seconds and dried.

A pattern form, sensitivity and resolution were evaluated with each resist pattern obtained. Specifically, the pattern form was determined by observation of the pattern obtained through a scanning electron microscope and a pattern in a rectangular form was evaluated good.

The sensitivity was evaluated in terms of an exposure amount necessary for reproducing a mask pattern of 0.25 μm.

The resolution was evaluated in terms of threshold resolution in an exposure amount necessary for reproducing a mask pattern of 0.25 μm.

The pattern form, sensitivity and resolution thus obtained are shown in Table 4 below.

TABLE 4

Sensitivity, Resolution and Pattern Form of Resist Film using Resin of the Present Invention

| Resin of the Present Invention | Sensitivity (mJ/cm$^2$) | Resolution (μm) | Pattern Form |
| --- | --- | --- | --- |
| (p-1) | 19 | 0.20 | good |
| (p-2) | 20 | 0.20 | good |
| (p-4) | 24 | 0.18 | good |
| (p-5) | 22 | 0.18 | good |
| (p-8) | 21 | 0.20 | good |
| (p-10) | 25 | 0.18 | good |

It can be seen from the results shown in Table 4 that the resist composition of the present invention exhibits high sensitivity and good resolution and provides a good pattern form. Specifically, the resist composition was favorably developed with a conventionally employed developing solution having ordinary concentration (an aqueous tetramethylammonium hydroxide solution) without the occurrence of decrease in film thickness and deterioration of adhesion to a substrate and provided the good pattern form while maintaining the excellent sensitivity and resolution.

As is apparent from the description above, the positive resist composition containing the resin according to the present invention has high transmittance to a far ultraviolet ray having a wavelength of 220 nm or less and exhibits good dry etching resistance. Further, the positive resist composition exhibits high sensitivity and good resolution and provides good pattern profile when a far ultraviolet ray having a wavelength of 220 nm or less (particularly an ArF excimer laser beam) is employed as an exposure light source, and thus it can be effectively employed for the formation of fine pattern necessary for the production of semiconductor elements.

While the invention has been described in detail and with reference to specific embodiments thereof, it will be apparent to one skilled in the art that various changes and modifications can be made therein without departing from the spirit and scope thereof.

What is claimed is:

1. A positive resist composition which comprises (A) a compound which generates an acid upon irradiation with an actinic ray or radiation, and (B) a resin which is decomposed by the action of an acid to increase solubility in an alkaline developing solution and contains a repeating unit represented by the following formula (I) and a repeating unit represented by the following formula (V):

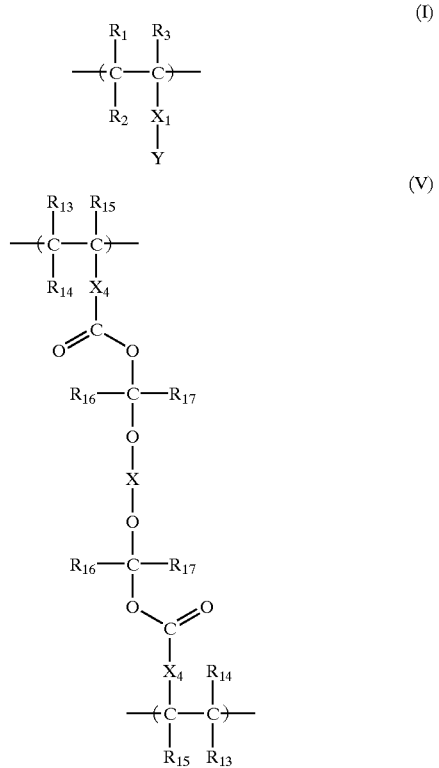

wherein $R_1$, $R_3$, $R_{13}$ and $R_{15}$, which may be the same or different, each independently represents a hydrogen atom, a halogen atom, a cyano group, an alkyl group or a haloalkyl group; $R_2$ and $R_{14}$, which may be the same or different, each independently represents a hydrogen atom, a cyano group, —CO—$OR_{18}$ or —CO—N($R_{19}$)($R_{20}$); $X_1$ and $X_4$, which may be the same or different, each independently represents a single bond, an optionally substituted divalent alkylene, alkenylene or cycloalkylene group, —O—, —$SO_2$—, —O—CO—$R_{21}$—, —CO—O—$R_{22}$— or —CO—N($R_{23}$)—$R_{24}$—; $R_{16}$ and $R_{17}$, which may be the same or different, each independently represents a hydrogen atom, an alkyl group or a cycloalkyl group, or $R_{16}$ and $R_{17}$ may be bonded to each other to form a ring; X represents an optionally substituted divalent alkylene, alkenylene or cycloalkylene group, or a divalent group formed by combining each of these alkylene, alkenylene and cycloalkylene groups with at least one of ether, ester, amido, urethane and ureido groups; Y represents a polycyclic alicyclic group having at least one alicyclic moiety selected from the group consisting of

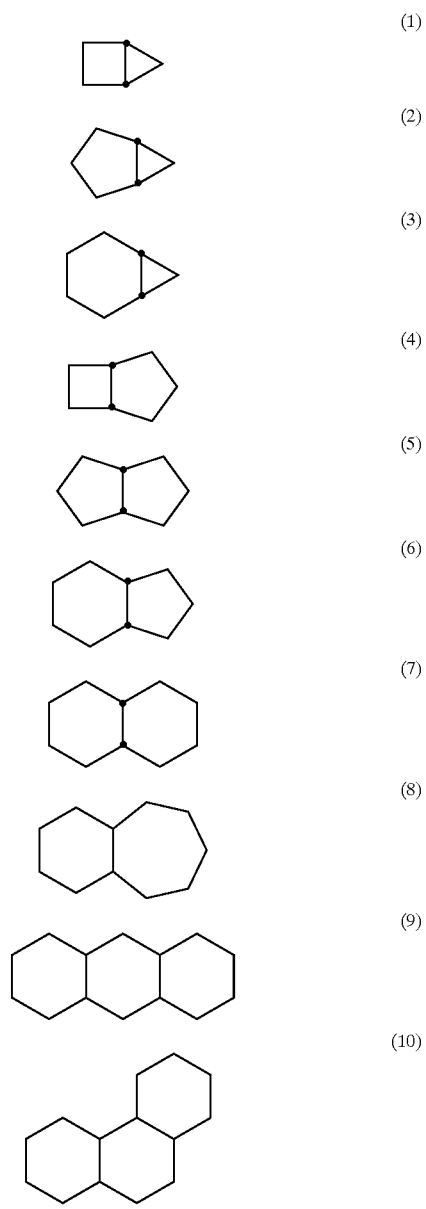

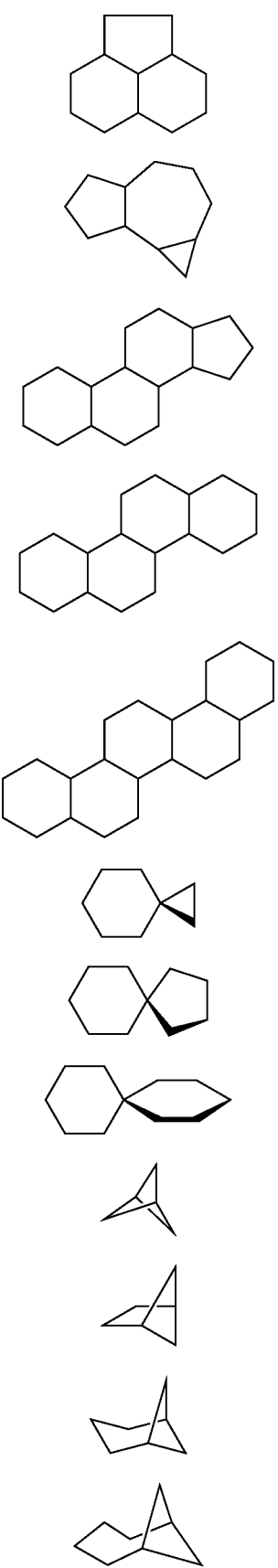
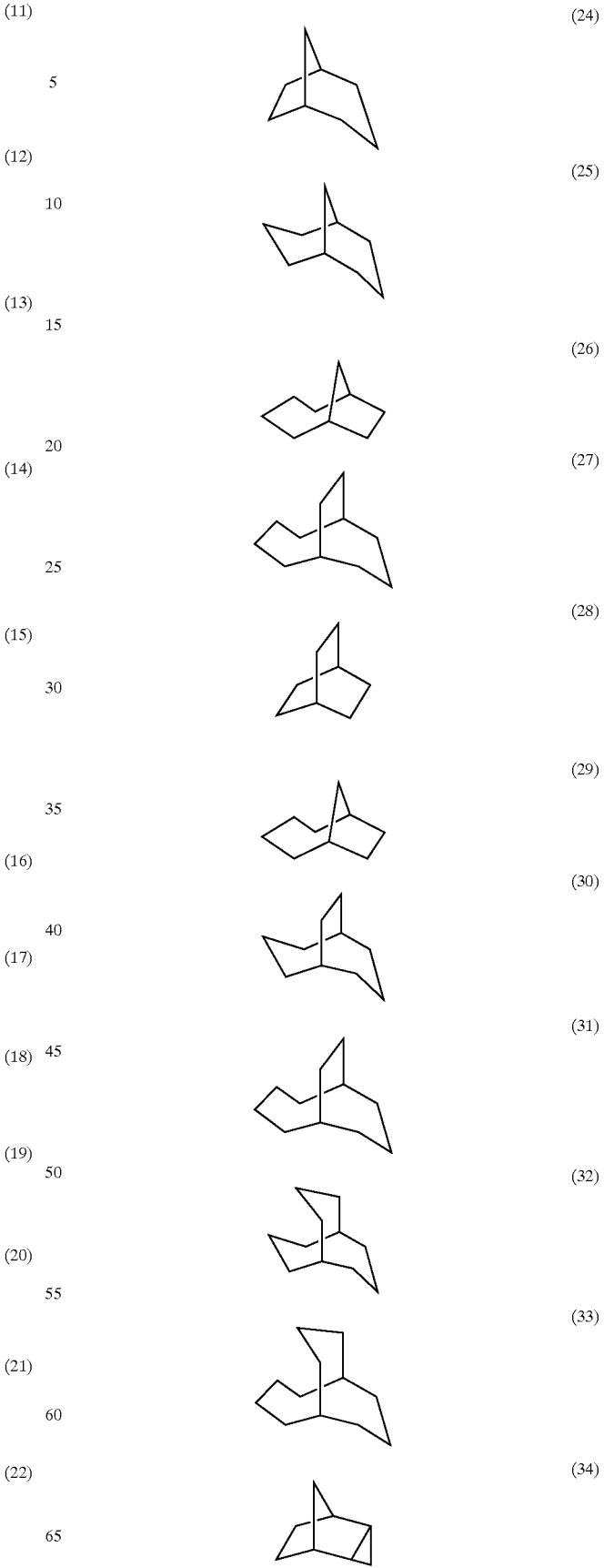

-continued

(35) 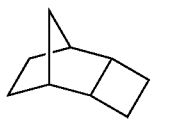

(37) 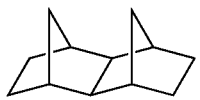

(38) 

(39) 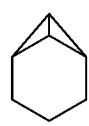

(41) 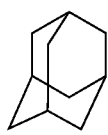

(42) 

(43) 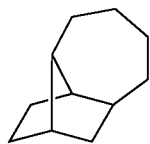

(44) 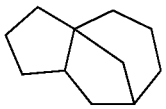

(45) 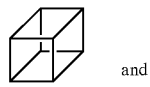 and

(46) 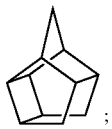 ;

$R_{18}$ represents a hydrogen atom, an alkyl group, a cycloalkyl group, an alkenyl group or an acid-decomposable group; $R_{19}$, $R_{20}$ and $R_{23}$, which may be the same or different, each independently represents a hydrogen atom, an alkyl group, a cycloalkyl group or an alkenyl group, or $R_{19}$ and $R_{20}$ may be bonded to each other to form a ring; and $R_{21}$, $R_{22}$ and $R_{24}$, which may be the same or different, each independently represents a single bond or a divalent alkylene, alkenylene or cycloalkylene group, which may contain at least one of ether, ester, amido, urethane and ureido groups; $R_{16}$ represents a hydrogen atom, an alkyl group or a cycloalkyl group; $R_{29}$ and $R_{30}$, which may be the same or different, each independently represents a hydrogen atom, an alkyl group or a cycloalkyl group; and two of $R_{16}$, $R_{29}$ and $R_{30}$ may be bonded to each other to form a three-membered to eight-membered cyclic structure comprising carbon atoms and optionally one or more hetero atoms, wherein the composition is suitable for exposure using a far ultraviolet ray having a wavelength of 220 nm or less as an exposure light source, wherein the resin of component (B) further contains a repeating unit represented by the following formula (II):

 (II)

wherein $R_4$ and $R_6$, which may be the same or different, each independently represents a hydrogen atom, a halogen atom, a cyano group, an alkyl group or a haloalkyl group; $R_5$ represents a hydrogen atom, a cyano group, —CO—$OR_{18}$ or —CO—N($R_{19}$)($R_{20}$); $X_2$ represents a single bond, an optionally substituted divalent alkylene, alkenylene or cycloalkylene group, —O—, —$SO_2$—, —O—CO—$R_{21}$—, —CO—O—$R_{22}$— or —CO—N($R_{23}$)—$R_{24}$—; B represents a group which is decomposed by the action of an acid to increase solubility in an alkaline developing solution (an acid decomposable group); and $R_{18}$, $R_{19}$, $R_{20}$, $R_{21}$, $R_{22}$, $R_{23}$, and $R_{24}$ are defined as above;

and wherein the resin of component (B) still further contains a repeating unit represented by the following formula (IV):

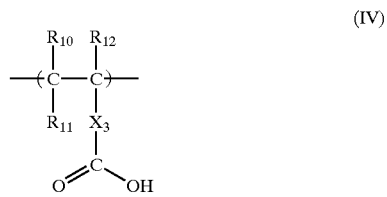 (IV)

wherein $R_{10}$ and $R_{12}$, which may be the same or different, each independently represents a hydrogen atom, a halogen atom, a cyano group, an alkyl group or a haloalkyl group; $R_{11}$ represents a hydrogen atom, a cyano group, —CO—$OR_{18}$ or —CO—N($R_{19}$)($R_{20}$); $X_3$ represents a single bond, an optionally substituted divalent alkylene, alkenylene or cycloalkylene group, —O—, —$SO_2$—, —O—CO—$R_{21}$—, —CO—O—$R_{22}$— or —CO—N($R_{23}$)—$R_{24}$—; and $R_{18}$, $R_{19}$, $R_{20}$, $R_{21}$, $R_{22}$, $R_{23}$, and $R_{24}$ are defined as above.

2. A positive resist composition as claimed in claim 1, wherein the resin of component (B) further contains a repeating unit represented by the following formula (III):

 (III)

wherein $R_7$ and $R_9$, which may be the same or different, each independently represents a hydrogen atom, a halogen atom, a cyano group, an alkyl group or a haloalkyl group; $R_8$ represents a hydrogen atom, a cyano group, —CO—OR$_{18}$ or —CO—N(R$_{19}$)(R$_{20}$); A represents a cyano group, —CO—OR$_{18}$ or —CO—N(R$_{19}$)(R$_{20}$); R$_{18}$ represents a hydrogen atom, an alkyl group, a cycloalkyl group, an alkenyl group or an acid-decomposable group; R$_{19}$, R$_{20}$ and R$_{23}$, which may be the same or different, each independently represents a hydrogen atom, an alkyl group, a cycloalkyl group or an aklenyl group, or R$_{19}$ and R$_{20}$ may be bonded to each other to form a ring; and R$_{21}$, R$_{22}$ and R$_{24}$, which may be the same or different, each independently represents a single bond or a divalent alkylene, alkenylene or cycloalkylene group, which may contain at least one of ether, ester, amido, urethane and ureido groups.

3. A positive resist composition as claimed in claim 1, wherein the acid-decomposable group contained in the resin of component (B) is an acid-decomposable group represented by the following formula (VI) or (VII):

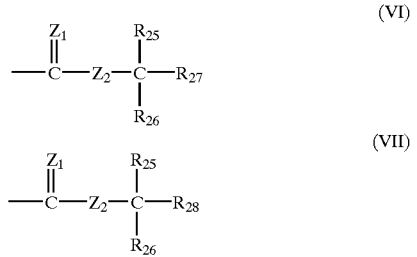

wherein Z$_1$ and Z$_2$, which may be the same or different, each independently represents an oxygen atom or a sulfur atom; R$_{25}$ to R$_{27}$, which may be the same or different, each independently represents a hydrogen atom, an alkyl group, a cycloalkyl group, an alkenyl group, an acyl group or an alkoxycarbonyl group; and R$_{28}$ represents an alkyl group, a cycloalkyl group or an alkenyl group, provided that at least two of R$_{25}$ to R$_{27}$ in formula (VI) represent the groups other than a hydrogen atom; or two of R$_{25}$ to R$_{27}$ in formula (VI) or two of R$_{25}$, R$_{26}$ and R$_{28}$ in formula (VII) may be bonded to each other to form a three-membered to eight-membered cyclic structure comprising carbon atoms and optionally one or more hetero atoms.

4. A positive resist composition as claimed in claim 1, wherein the resin of component (B) is a resin obtained by a reaction between a resin containing a repeating unit represented by formula (I) described above and a repeating unit represented by formula (IV) described above and a compound represented by the following formula (VIII):

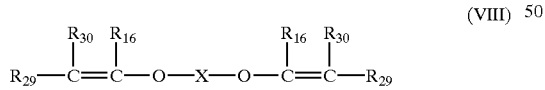

wherein X represents an optionally substituted divalent alkylene, alkenylene or cycloalkylene group, or a divalent group formed by combining each of these alkylene, alkenylene and cycloalkylene groups with at least one of ether, ester, amido, urethane and ureido groups; R$_{16}$ represents a hydrogen atom, an alkyl group or a cycloalkyl group; R$_{29}$ and R$_{30}$, which may be the same or different, each independently represents a hydrogen atom, an alkyl group or a cycloalkyl group; and two of R$_{16}$, R$_{29}$ and R$_{30}$ may be bonded to each other to form a three-membered to eight-membered cyclic structure comprising carbon atoms and optionally one or more hetero atoms.

5. A positive resist composition as claimed in claim 1, wherein the composition further comprises a low molecular weight acid-decomposable dissolution inhibiting compound solubility of which in an alkaline developing solution increases by the action of an acid and which has a group capable of being decomposed by the action of an acid and a molecular weight of 3,000 or less.

6. A positive resist composition as claimed in claim 1, wherein a content of the repeating unit represented by formula (V) in the resin of component (B) is from 0.1 to 10% by mole based on the total repeating units of the resin.

7. A positive resist composition as claimed in claim 1, wherein a content of the repeating unit represented by formula (I) in the resin of component (B) is from 30 to 70% by mole based on the total repeating units of the resin.

8. A positive resist composition as claimed in claim 1, wherein a content of the repeating unit represented by formula (IV) in the resin of component (B) is 20% by mole or less based on the total repeating units of the resin.

9. A positive resist composition as claimed in claim 1, wherein a content of the repeating unit represented by formula (II) in the resin of component (B) is 60% by mole or less based on the total repeating units of the resin.

10. The positive resist composition as claimed in claim 1, wherein the acid-decomposable group contained in the resin of component (B) is an acid-decomposable group represented by the following (VI) or (VII):

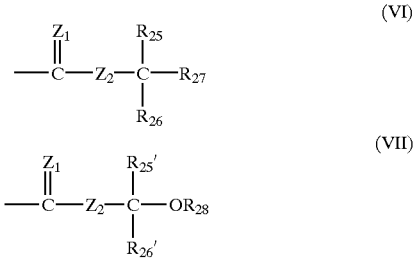

wherein Z$_1$ and Z$_2$ in formulae (VI) and (VII), each independently represents an oxygen atom or a sulfur atom; R$_{25}$ to R$_{27}$ in formula (VI), each independently represents an alkyl group selected from the group consisting of an ethyl group, a propyl group, an n-butyl group, a sec-butyl group, a hexyl group, a 2-ethylhexyl group and an octyl group, a cycloalkyl group and an alkenyl group;

at least two of R$_{25}$ to R$_{27}$ in formula (VI) may be bonded to each other to form a three-membered to eight-membered cyclic structure; and R$_{28}$ in formula (VII) represents an alkyl group, a cycloalkyl group or an alkyenyl group; and R$_{25}$' and R$_{26}$' in formula (VII), each independently represents a hydrogen atom, an alkyl group, a cycloalkyl group or an alkenyl group.

* * * * *